US012666791B2

(12) United States Patent
Kim et al.

(10) Patent No.: US 12,666,791 B2
(45) Date of Patent: Jun. 23, 2026

(54) DISPLAY DEVICE AND MOBILE TERMINAL INCLUDING THE SAME

(71) Applicant: LG Display Co., Ltd., Seoul (KR)

(72) Inventors: Tae Hun Kim, Paju-si (KR); Bo Gun Seo, Paju-si (KR); Guen Sik Lee, Paju-si (KR); Kyu Jin Kim, Paju-si (KR); Bo Yun Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 417 days.

(21) Appl. No.: 17/883,229

(22) Filed: Aug. 8, 2022

(65) Prior Publication Data

US 2023/0137445 A1 May 4, 2023

(30) Foreign Application Priority Data

Oct. 28, 2021 (KR) ........................ 10-2021-0145329

(51) Int. Cl.
*G06V 40/16* (2022.01)
*G02B 5/18* (2006.01)
(Continued)

(52) U.S. Cl.
CPC ......... *H10K 50/841* (2023.02); *G02B 5/1819* (2013.01); *G02B 5/32* (2013.01);
(Continued)

(58) Field of Classification Search
CPC ............. G06K 9/0004; G06V 40/1318; G06V 10/145; G09G 2360/14; G09G 2360/145;

G09G 2360/147; H01L 27/3227; H01L 25/167; H01L 27/3234; H10K 59/60; H10K 59/65
See application file for complete search history.

(56) References Cited

U.S. PATENT DOCUMENTS

2008/0198302 A1 * 8/2008 Cho ..................... G02B 5/3058
359/484.01
2015/0144934 A1 * 5/2015 Rappoport ............. G06F 3/042
257/40
(Continued)

FOREIGN PATENT DOCUMENTS

CN 111564474 A 8/2020
CN 111935340 A 11/2020
(Continued)

*Primary Examiner* — Yuzhen Shen
(74) *Attorney, Agent, or Firm* — Birch, Stewart, Kolasch & Birch, LLP

(57) ABSTRACT

A display device and a mobile terminal including the display device are discussed. The display device can include a display panel including a first pixel area and a second pixel area, a cover glass disposed on a first surface of the display panel in the second pixel area, an optical module disposed under a second surface of the display panel to face the second pixel area and configured to direct infrared light towards a light transmitting part of the second pixel area, and a diffractive optical element disposed on or in at least one of the cover glass and the display panel at a position corresponding to the light transmitting part of the second pixel area. The diffractive optical element can separate the infrared light from the optical module into a plurality of dot beams.

21 Claims, 20 Drawing Sheets

(51) Int. Cl.

| | |
|---|---|
| *G02B 5/32* | (2006.01) |
| *G09G 3/3233* | (2016.01) |
| *H04N 23/53* | (2023.01) |
| *H04N 23/56* | (2023.01) |
| *H04N 23/63* | (2023.01) |
| *H10K 50/84* | (2023.01) |
| *H10K 59/35* | (2023.01) |
| *G02B 27/30* | (2006.01) |
| *G06F 3/041* | (2006.01) |
| *H04M 1/02* | (2006.01) |

(52) U.S. Cl.
CPC ......... *G06V 40/172* (2022.01); *G09G 3/3233* (2013.01); *H04N 23/53* (2023.01); *H04N 23/56* (2023.01); *H04N 23/63* (2023.01); *H10K 59/35* (2023.02); *G02B 27/30* (2013.01); *G06F 3/0412* (2013.01); *G09G 2300/0452* (2013.01); *G09G 2300/0819* (2013.01); *G09G 2300/0842* (2013.01); *G09G 2310/08* (2013.01); *H04M 1/0266* (2013.01)

(56) References Cited

U.S. PATENT DOCUMENTS

| | | | |
|---|---|---|---|
| 2017/0017834 A1* | 1/2017 | Sabitov ................ | G06V 40/172 |
| 2019/0129510 A1* | 5/2019 | Wang ...................... | G06F 3/042 |
| 2020/0258953 A1* | 8/2020 | Bae ........................ | H10K 59/60 |
| 2021/0065635 A1* | 3/2021 | Choi .................... | G09G 3/3225 |
| 2021/0216163 A1* | 7/2021 | Wang ...................... | G02F 1/294 |
| 2022/0330410 A1* | 10/2022 | Shanjani ................. | H04B 5/70 |

FOREIGN PATENT DOCUMENTS

| | | |
|---|---|---|
| JP | 2007-233171 A | 9/2007 |
| KR | 10-2011-0004056 A | 1/2011 |
| KR | 10-2019-0101836 A | 9/2019 |
| KR | 10-2020-0054936 A | 5/2020 |
| KR | 10-2021-0048972 A | 5/2021 |
| KR | 10-2021-0080990 A | 7/2021 |

* cited by examiner

DOE

AG

| R | G | B | | R | G | B | | R | G | B | ~14
~12

DOE

AG

| R | G | B | | R | G | B | | R | G | B | ~14
~12

DISPLAY DEVICE AND MOBILE TERMINAL INCLUDING THE SAME

CROSS-REFERENCE TO RELATED APPLICATION

This application claims priority to and the benefit of Korean Patent Application No. 10-2021-0145329, filed in the Republic of Korea on Oct. 28, 2021, the disclosure of which is incorporated herein by reference in its entirety into the present application.

BACKGROUND OF THE DISCLOSURE

1. Field

The present disclosure relates to a display device and a mobile terminal including the display device, and more particularly, to a display device in which an optical device is disposed under a display panel, and a mobile terminal including the display device.

2. Discussion of Related Art

Electroluminescent display devices are generally classified into inorganic light emitting display devices and organic light emitting display devices according to the materials of light emitting layers. Active matrix type organic light emitting display devices include organic light-emitting diodes (hereinafter referred to as "OLEDs"), which emit light by themselves, and have fast response speeds and advantages in which light emission efficiencies, brightness, and viewing angles are high.

In the organic light-emitting display devices, the OLEDs are formed in pixels. Since the organic light-emitting display devices have fast response speeds and are excellent in light emission efficiency, brightness, and viewing angle as well as being able to exhibit a black gradation in a full black color, the organic light-emitting display devices are excellent in a contrast ratio and color reproducibility.

Recently, various optical devices have been added to mobile terminals. Examples of the mobile terminals can include smart phones or tablets. The optical devices can include a sensor or lighting device necessary to support a multimedia function or perform biometric recognition. The optical device can be implemented as an optical module and assembled under a display panel of the mobile terminal.

In order to enlarge a screen of the mobile terminal, a light emitting surface and a light receiving surface of the optical module can be disposed in a notch area designed in a concave shape on the top of the screen of the display panel or in a punch hole in the screen of the mobile terminal. However, due to the notch area or the punch hole, there can be many limitations in screen design, and the thickness of the mobile terminal can increase due to the thick nature of the optical module.

SUMMARY OF THE DISCLOSURE

The present disclosure is directed to solve or address the aforementioned needs and/or problems associated with the related art.

The present disclosure provides a display device capable of increasing the degree of freedom in screen design and making an optical module slimmer, and a mobile terminal including such display device.

The problems or limitations to be solved or addressed by the present disclosure are not limited to those mentioned above, and other problems or limitations not mentioned will be clearly understood by those skilled in the art from the following description.

A display device according to one exemplary embodiment of the present disclosure can include a display panel in which an input image is reproduced in a first pixel area and a second pixel area including one or more light transmitting parts, a cover glass disposed on a front surface of the display panel, a light source disposed under a rear surface of the display panel to face the second pixel area, and a diffractive optical element disposed on at least one of the cover glass and the display panel at a position facing the light transmitting part of the second pixel area and configured to separate infrared light from the light source into a plurality of dot beams.

A mobile terminal according to one exemplary embodiment of the present disclosure can include a display panel in which an input image is reproduced in a first pixel area and a second pixel area including one or more light transmitting parts, a display panel driver configured to write pixel data of an input image to pixels of the display panel, a cover glass disposed on a front surface of the display panel, a light source disposed under a rear surface of the display panel to face the second pixel area, a diffractive optical element disposed on at least one of the cover glass and the display panel at a position facing the light transmitting part of the second pixel area and configured to separate infrared light from the light source into a plurality of dot beams, an infrared camera disposed under the rear surface of the display panel and configured to convert the infrared light incident through the display panel into an electrical signal to output facial pattern data, and a host system configured to transmit the pixel data of the input image to the display panel driver and configured to process user authentication with respect to the facial pattern data received from the infrared camera.

A display device according to one embodiment of the present disclosure can include a display panel including a first pixel area and a second pixel area adjacent to the first pixel area, the second pixel area including one or more light transmitting parts; a cover glass disposed on a first surface of the display panel in the second pixel area; an optical module disposed under a second surface of the display panel to face the second pixel area, and configured to direct infrared light towards the one or more light transmitting parts of the second pixel area; and a diffractive optical element disposed on or in at least one of the cover glass and the display panel at a position corresponding to at least one of the one or more light transmitting parts of the second pixel area, the diffractive optical element configured to separate the infrared light from the optical module into a plurality of dot beams.

These and other objects of the present application will become more readily apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the below detailed description.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 4 is a view illustrating a pixel arrangement in a first pixel area;

FIG. 11 is a view illustrating an example in which the display device according to an exemplary embodiment of the present disclosure is applied to a mobile device;

FIG. 12 is a cross-sectional view illustrating a display device according to a first exemplary embodiment of the present disclosure;

FIG. 13 is a cross-sectional view illustrating a display device according to a second exemplary embodiment of the present disclosure;

FIG. 23 is a cross-sectional view illustrating a display device according to an eighth exemplary embodiment of the present disclosure.

DETAILED DESCRIPTION OF EMBODIMENTS

Figure 1:
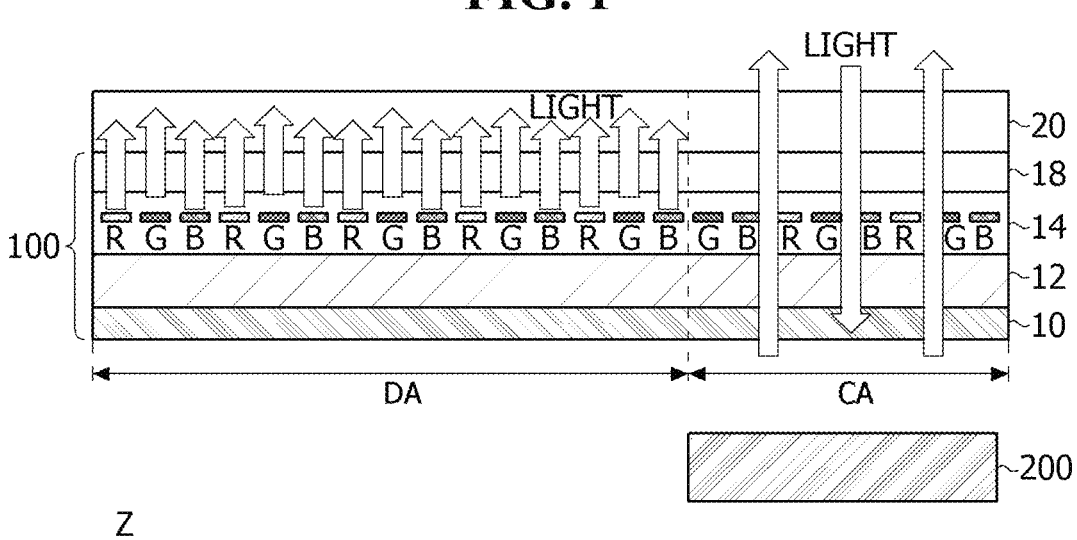
FIG. 1 is a cross-sectional view schematically illustrating a display panel according to an exemplary embodiment of the present disclosure.

The advantages and features of the present disclosure and methods for accomplishing the same will be more clearly understood from embodiments described below with reference to the accompanying drawings. However, the present disclosure is not limited to the following embodiments but can be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies can be omitted to avoid unnecessarily obscuring the subject matter of the present disclosure.

The terms such as "comprising," "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two components is described using the terms such as "on," "above," "below," and "next," one or more components can be positioned between the two components unless the terms are used with the term "immediately" or "directly."

The terms "first," "second," and the like can be used to distinguish components from each other, but the functions or structures of the components are not limited by ordinal numbers or component names in front of the components. These terms may not define any order.

The same reference numerals can refer to substantially the same elements throughout the present disclosure.

The following embodiments can be partially or entirely bonded to or combined with each other and can be linked and operated in technically various ways. The embodiments can be carried out independently of or in association with each other.

In each display device of the present disclosure, each of the pixels can include a plurality of sub-pixels having different colors in order to reproduce the color of the image on a screen of the display panel. Each of the sub-pixels includes a transistor used as a switch element or a driving element. Such a transistor can be implemented as a TFT (Thin Film Transistor).

A driving circuit of each display device of the present disclosure writes a pixel data of an input image to the pixels on the display panel. To this end, the driving circuit of the display device can include a data driving circuit configured to supply data signal to the data lines, a gate driving circuit configured to supply a gate signal to the gate lines, and the like.

In each display device of the present disclosure, the pixel circuit and the gate driving circuit can include a plurality of transistors. Transistors can be implemented as oxide thin film transistors (oxide TFTs) including an oxide semiconductor, low temperature polysilicon (LTPS) TFTs including low temperature polysilicon, or the like. Each of the transistors can be implemented as a p-channel TFT or an n-channel TFT.

Generally, a transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers can flow from a source to a drain.

In the case of an n-channel transistor, since carriers are electrons, a source voltage is a voltage lower than a drain voltage such that electrons can flow from a source to a drain. The n-channel transistor has a direction of a current flowing from the drain to the source. In the case of a p-channel transistor, since carriers are holes, a source voltage is higher than a drain voltage such that holes can flow from a source to a drain. In the p-channel transistor, since holes flow from the source to the drain, a current flows from the source to the drain. It should be noted that a source and a drain of a transistor are not fixed. For example, a source and a drain can be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor.

The transistor is turned on in response to the gate-on voltage and is turned off in response to the gate-off voltage. In the case of the n-channel transistor, a gate-on voltage can be a gate high voltage VGH and VEH, and a gate-off voltage can be a gate low voltage VGL and VEL. In the case of the p-channel transistor, a gate-on voltage can be a gate low voltage VGL and VEL, and a gate-off voltage can be a gate high voltage VGH and VEH.

Hereinafter, various embodiments of the present disclosure will be described in detail with reference to the accompanying drawings. In the following embodiments, a display device will be described focusing on an organic light emitting display device, but the present disclosure is not limited thereto. Further, all the components of each display device according to all embodiments of the present disclosure are operatively coupled and configured.

Figure 2:
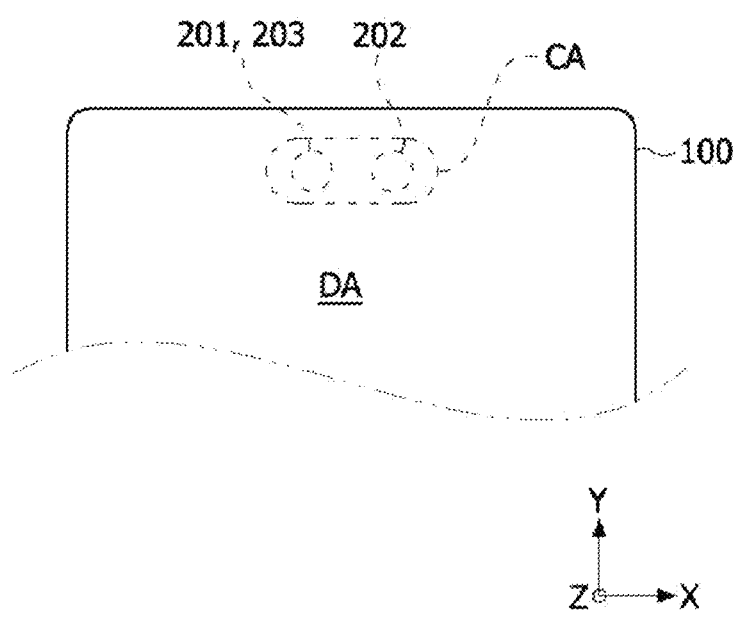
FIG. 2 is a view illustrating an optical device overlapping a second pixel area of the display panel.
Figure 3:
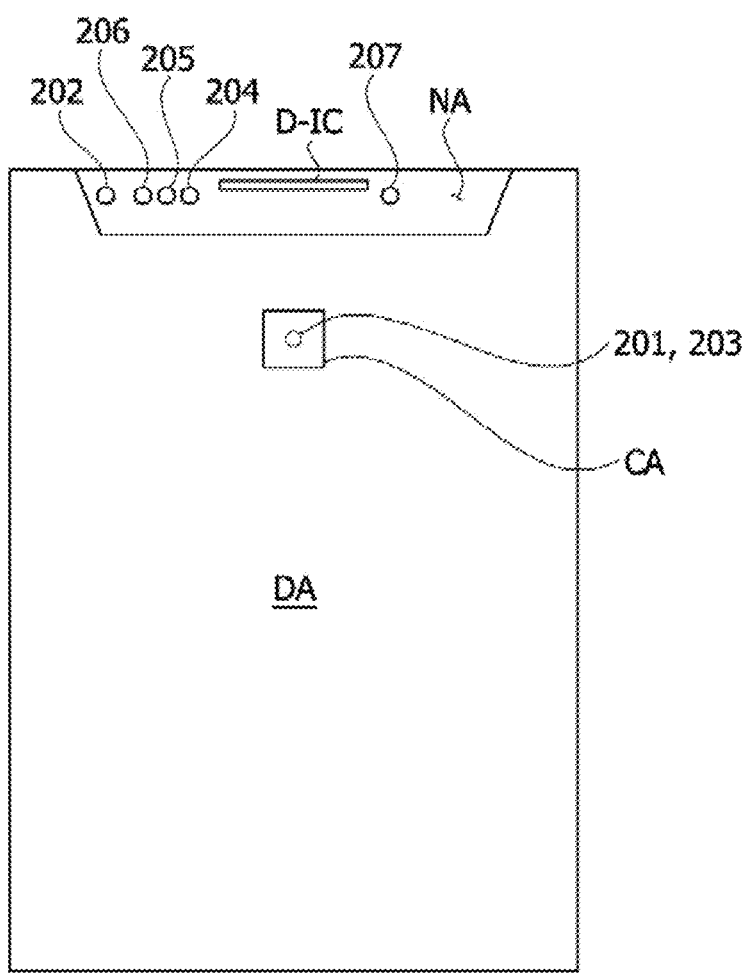
FIG. 3 is a view illustrating an example of optical devices disposed in the second pixel area and a notch area.
Figure 3:
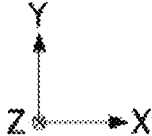

FIG. 1 is a cross-sectional view schematically illustrating a display panel (or a portion thereof) according to an embodiment of the present disclosure, and FIG. 2 is a view illustrating an optical device overlapping a second pixel area of the display panel of FIG. 1. Further, FIG. 3 is a view illustrating an example of optical devices disposed in the second pixel area and a notch area of the display panel. The display panels of FIGS. 2 and 3 can be display panels of various mobile terminals.

Referring to FIGS. 1 and 2, a display panel 100 of a display device includes a screen that reproduces an input image.

The screen of the display panel 100 can include a first pixel area DA and a second pixel area CA. The first pixel area DA is a display area in which a plurality of pixels are disposed and the input image is reproduced. The first pixel area DA is preferably larger than the second pixel area CA and is a main display area of the screen in which most of the image is displayed. The second pixel area CA is a display area in which a plurality of pixels are disposed and the input image is reproduced. Pixels per inch (PPI) or resolution of the second pixel area CA is equal to or lower than that of the first pixel area DA. Hereinafter, the PPI of the second pixel area CA will be described as lower than that of the first pixel area DA.

The second pixel area CA can include a plurality of light transmitting parts having no medium for blocking light. The light transmitting part can be disposed between sub-pixels of the second pixel area CA. Light can pass through the light transmitting part with little loss. When the PPI or resolution of the second pixel area CA is smaller than that of the first pixel area DA, the light transmitting part disposed in the second pixel area CA can be larger.

Each of the first pixel area DA and the second pixel area CA includes pixels in which pixel data of the input image is written. Accordingly, the input image can be displayed in the first pixel area DA and/or the second pixel area CA.

Each of the pixels of the first pixel area DA and the second pixel area CA includes sub-pixels having different colors to implement colors of images. Such sub-pixels can include red, green, and blue sub-pixels. Each of the pixels P can further include a white sub-pixel, or can include known combinations of different color sub-pixels. Further, each of the sub-pixels can include a pixel circuit for driving a corresponding light emitting element.

When the PPI or resolution of the second pixel area CA is lower than that of the first pixel area DA, an image quality compensation algorithm for compensating for luminance and color coordinates of pixels in the second pixel area CA can be applied.

One or more optical devices (or modules) 200 can be disposed under a rear surface of the display panel 100 and can overlap the second pixel area CA. The optical device 200 can include an image sensor (or camera), a proximity sensor, a white light illuminator, an optical element for face recognition, etc.

As one example of the optical device 200, the optical element for face recognition can include an infrared light source, an infrared camera, an infrared illuminator, etc., under the second pixel area CA of the display panel 100 as shown in FIG. 1.

In FIG. 2, reference numeral 201 denotes an infrared light source, and reference numeral 202 denotes an infrared camera. As such, the optical device 200 disposed under the second pixel area CA shown in FIG. 1 can be an infrared light source 201 and/or an infrared imaging device 202 in FIG. 2, but is not limited thereto. For example, as in the example of FIG. 3, only the infrared light source 201 can be disposed under the second pixel area CA, or an image sensor, a proximity sensor, a white light illuminator, an infrared illuminator, or the like can be further disposed under the second pixel area CA.

The infrared light source 201 can include a vertical-cavity surface-emitting laser (VCSEL), a lens for expanding and collimating the light emitted from the laser, and a light guide.

Referring to FIGS. 1 and 2, a transparent cover glass 20 can be adhered to a front surface of the display panel 100. The second pixel area CA or the cover glass 20 of the display panel 100 includes a diffractive optical element 203 disposed at a position facing the infrared light source 201. The diffractive optical element 203 can include one or more of a diffractive optical element (DOE) and a hologram optical element (HOE).

In the examples of FIGS. 2 and 3, the diffractive optical element is disposed in the second pixel area CA, and the infrared light source is disposed under the rear surface of the display panel 100 to face the diffractive optical element 203.

In FIG. 3, an ambient light sensor 204, a proximity sensor 205, a flood illuminator 206, an infrared camera 202, and a front camera 207 are disposed in a notch area NA of the mobile terminal, and the diffractive optical element 203 and the infrared light source 201 are disposed in the second pixel area CA. The notch area NA is a non-display area having no pixels at the top of the screen. The mobile terminal can further include known components such as a communication unit configured to transceive signals to and from the mobile terminal, a user input unit (e.g., touch area) configured to receive user inputs, a memory/storage configured to store data, a controller/processor configured to control the components of the mobile terminal, etc.

The infrared illuminator can enable facial recognition even in a dark environment using a flood illuminator that generates an infrared (IR) flash. The diffractive optical element diffracts infrared light from the infrared light source 201 through a diffraction pattern or a hologram pattern and separates the infrared light into hundreds to thousands of dot beams. The infrared camera 202 captures dot beams of infrared wavelengths focused on a person's face. The infrared camera 202 can convert light of an infrared wavelength that has passed through the display panel 100 into an electrical signal and convert the electrical signal into digital data to generate facial pattern data. Accordingly, when the dot beams separated from the diffractive optical element are irradiated to a user's face, and the infrared dot beams reflected from the face are received by the infrared camera 202, user authentication can be processed in a biometric authentication module of a host system.

In the display device of the present disclosure, since the optical devices 200 are disposed under the rear surface of the display panel 100 to overlap the second pixel area CA, the display area of the screen is not limited by the optical devices 200. Accordingly, the display device of the present disclosure can implement a screen of a full-screen display by enlarging the display area of the screen and increase a degree of freedom in screen design.

The display panel 100 has a width in an X-axis direction, a length in a Y-axis direction, and a thickness in a Z-axis direction. The display panel 100 as shown in FIG. 1 can include a circuit layer 12 disposed on a substrate 10, and a light emitting element layer 14 disposed on the circuit layer 12. A polarizing plate 18 can be disposed on the light emitting element layer 14, and a cover glass 20 can be disposed on the polarizing plate 18.

The circuit layer 12 can include a pixel circuit connected to lines such as data lines, gate lines, power lines, and the like and a gate driving part connected to the gate lines. The circuit layer 12 can include circuit elements such as transistors implemented with thin film transistors (TFT), a capacitor, and the like. The lines and circuit elements of the circuit layer 12 can be implemented with a plurality of insulating layers, two or more metal layers spaced apart from each other with an insulating layer therebetween, and an active layer including a semiconductor material.

The light emitting element layer 14 can include a light emitting element driven by the pixel circuit. The light emitting element can be implemented with an organic light emitting diode (OLED). The OLED includes an organic compound layer formed between an anode and a cathode. The organic compound layer can include a hole injection layer (HIL), a hole transport layer (HTL), an emission layer (EML), an electron transport layer (ETL), and an electron injection layer (EIL), but the present disclosure is not limited thereto. When a voltage is applied to the anode and the cathode of the OLED, holes passing through the hole transport layer (HTL) and electrons passing through the electron transport layer (ETL) move to the emission layer (EML) and then form excitons, and thus visible light is emitted from the emission layer (EML).

The OLED used as the light emitting element EL can have a tandem structure in which a plurality of emission layers are stacked. The OLED having the tandem structure can improve the luminance and lifespan of the pixels. The light emitting element layer 14 can be disposed on the pixels which selectively can transmit red, green, and blue wavelengths, and can further include a color filter array.

The light emitting element layer 14 can be covered by a protective film, and the protective film can be covered by an encapsulation layer. A protective layer and the encapsulation layer can have a structure in which organic films and inorganic films are alternately stacked. The inorganic film blocks the penetration of moisture or oxygen. The organic film flattens the surface of the inorganic film. When the organic films and the inorganic films are stacked in multiple layers, since a passage for moisture or oxygen is longer than that of a single layer, the penetration of moisture or oxygen which affects the light emitting element layer 14 can be effectively blocked.

A touch sensor layer can be formed on the encapsulation layer, and the polarizing plate 18 or a color filter layer can be disposed thereon. The touch sensor layer can include capacitive touch sensors that sense a touch input based on a change in capacitance before and after the touch input. The touch sensor layer can include metal wiring patterns and insulating films that form the capacitance of the touch sensors. The insulating films can insulate portions intersecting the metal wiring patterns and can planarize the surface of the touch sensor layer. The polarizing plate 18 can improve visibility and a contrast ratio by converting the polarization of external light reflected by the metal of the touch sensor layer and the circuit layer. The polarizing plate 18 can be implemented as a polarizing plate in which a linear polarizing plate and a phase retardation film are bonded or a circular polarizing plate. The cover glass 20 can be adhered to the polarizing plate 18. The color filter layer can include red, green, and blue color filters. The color filter layer can further include a black matrix pattern. The color filter layer can absorb a portion of the wavelength of light reflected from the circuit layer and the touch sensor layer to replace the role of the polarizing plate 18 and increase the color purity of the image reproduced in a pixel array. In this case, the polarizing plate 18 is not needed and is omitted from the display panel.

Figure 4:
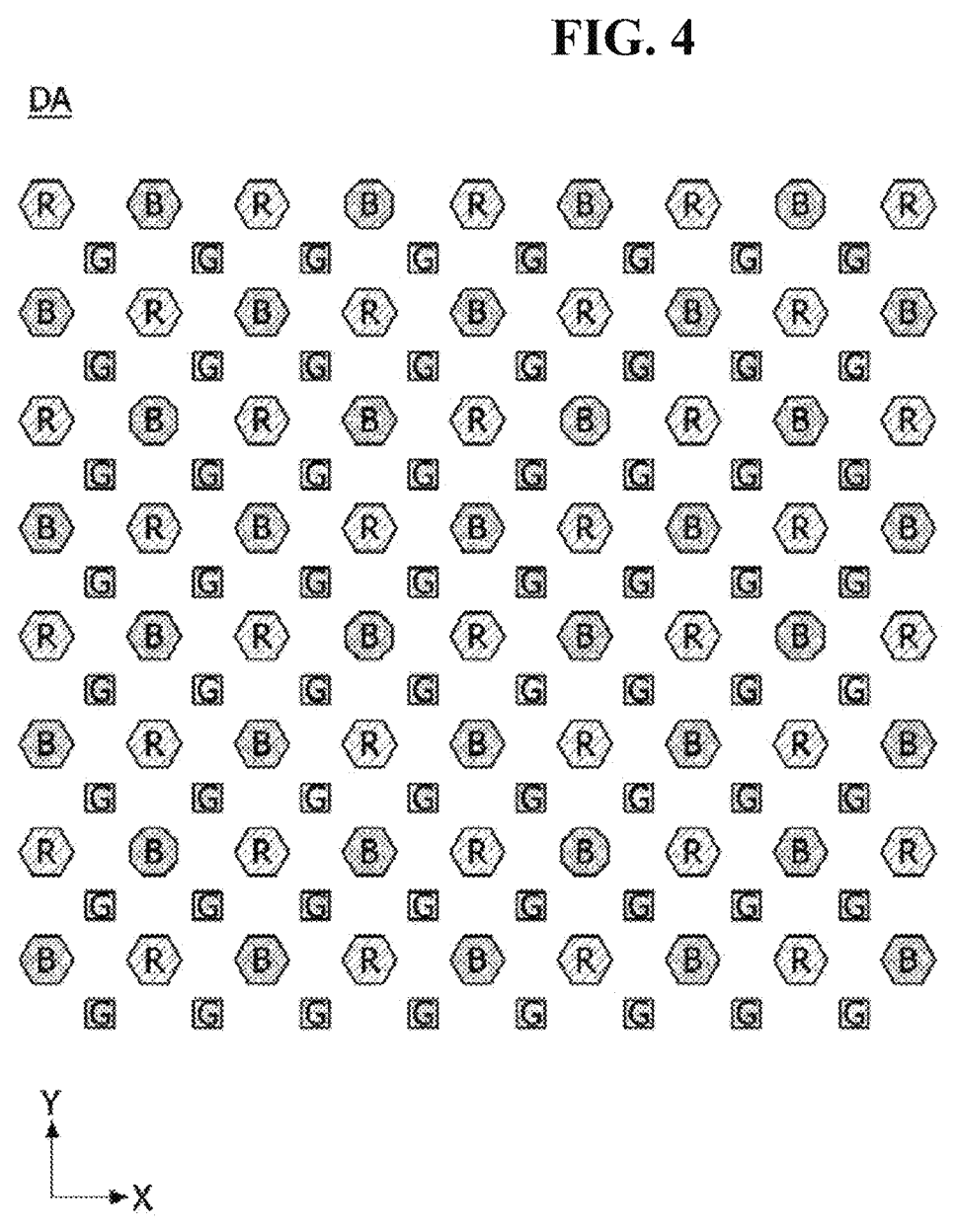
Figure 5:
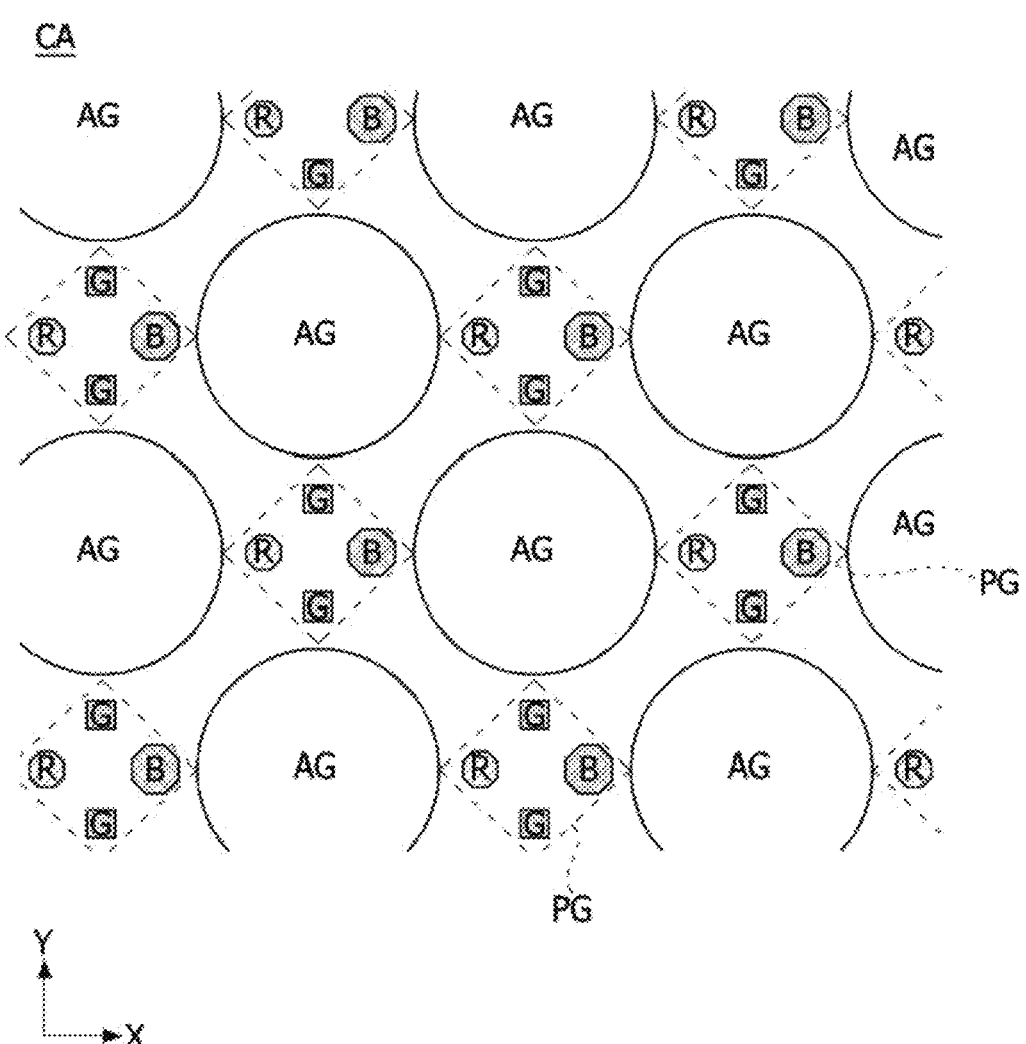
FIG. 5 is a view illustrating a pixel arrangement in the second pixel area.

FIG. 4 is a view illustrating an example of a pixel arrangement in the first pixel area. FIG. 5 is a view illustrating an example of pixels and a light transmitting part in the second pixel area. Wirings connected to the pixels are omitted in FIGS. 4 and 5 for the sake of clarify. The first and second pixel areas here can be examples of the first pixel area DA and the second pixel area CA of FIGS. 1-3.

Referring to FIG. 4, the first pixel area DA includes pixels arranged with a high PPI. Each of the pixels can be implemented as a real-type pixel in which R, G, and B sub-pixels of three primary colors are configured as one pixel. Each of the pixels can further include a W sub-pixel omitted from the drawing.

In each of the pixels, two sub-pixels can be considered as one pixel using a sub-pixel rendering algorithm. For example, a first pixel can be composed of a R subpixel and a first G sub-pixel, and a second pixel can be composed of a B subpixel and a second/next G sub-pixel. Insufficient color representation in each of the first and second pixels can be compensated for by an average value of corresponding color data between neighboring pixels.

In the sub-pixels, the luminous efficiency of the light emitting element can be different for each color. In consideration of this, the sizes of the sub-pixels can be different for each color. For example, among R, G, and B sub-pixels, the size of the B sub-pixel can be the largest and the size of the G sub-pixel can be the smallest.

Referring to FIG. 5, the second pixel area CA includes a pixel group spaced apart by a predetermined distance and light transmitting parts AG disposed between adjacent pixel groups PG. The pixel group PG includes sub-pixels disposed in an area indicated by a dotted line in FIG. 5.

External light is received by the lens of the optical device (e.g., 200) through the light transmitting parts AG. The light transmitting parts AG can include a transparent medium having high transmittance without a metal, so that light can be incident with minimal light loss and can be transmitted to the optical device (e.g., 200) disposed under the second pixel area CA. In other words, the light transmitting parts AG can be formed of transparent insulating materials without including metal wirings or pixels. Due to the light transmitting parts AG, the PPI of the second pixel area CA is lower than that of the first pixel area DA.

In the second pixel area CA, the pixel group can include one or two pixels. Each of the pixels of the pixel group can include two to four sub-pixels. For example, one pixel in the pixel group can include R, G, and B sub-pixels or include two sub-pixels, and further include a W sub-pixel. In the example of FIG. 5, the first pixel is composed of R and G sub-pixels, and the second pixel is composed of B and G sub-pixels, but the present disclosure is not limited thereto.

The shape of the light-transmitting parts AG is illustrated as a circular shape in FIG. 5, but is not limited thereto. For example, the light transmitting parts AG can be designed in any various shapes, such as a circular shape, an elliptical shape, or a polygonal shape.

Due to process variation and element characteristic variation caused in the manufacturing process of the display panel, there may be a difference in electrical characteristics of a driving element between pixels, and the difference may increase as the driving time of the pixels elapses. Internal compensation technology or external compensation technology can be applied to an organic light emitting display device to compensate for variations in the electrical characteristics of the driving element between the pixels.

The internal compensation technology senses a threshold voltage of the driving element for each sub-pixel using an internal compensation circuit implemented in each pixel circuit, and compensates a gate-source voltage Vgs of the driving element by the threshold voltage. The external compensation technology senses a current or voltage of the driving element that changes according to the electrical characteristics of the driving element in real time using an external compensation circuit. The external compensation technology compensates for the deviation (or change) of the electric characteristic of the driving element in each pixel in real time by modulating the pixel data (digital data) of the input image by the electric characteristic deviation (or change) of the driving element sensed for each pixel.

Figure 6:
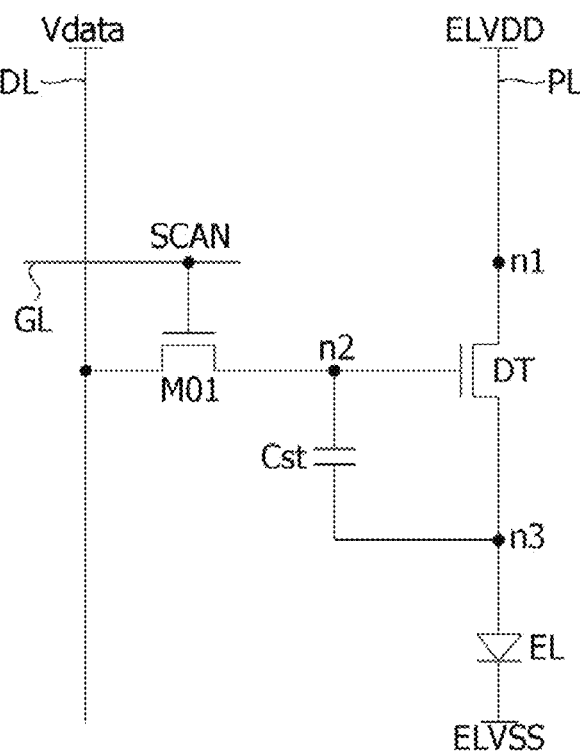
FIGS. 6 to 8 are circuit diagrams illustrating various pixel circuits applicable to a display device of the present disclosure.
Figure 7:
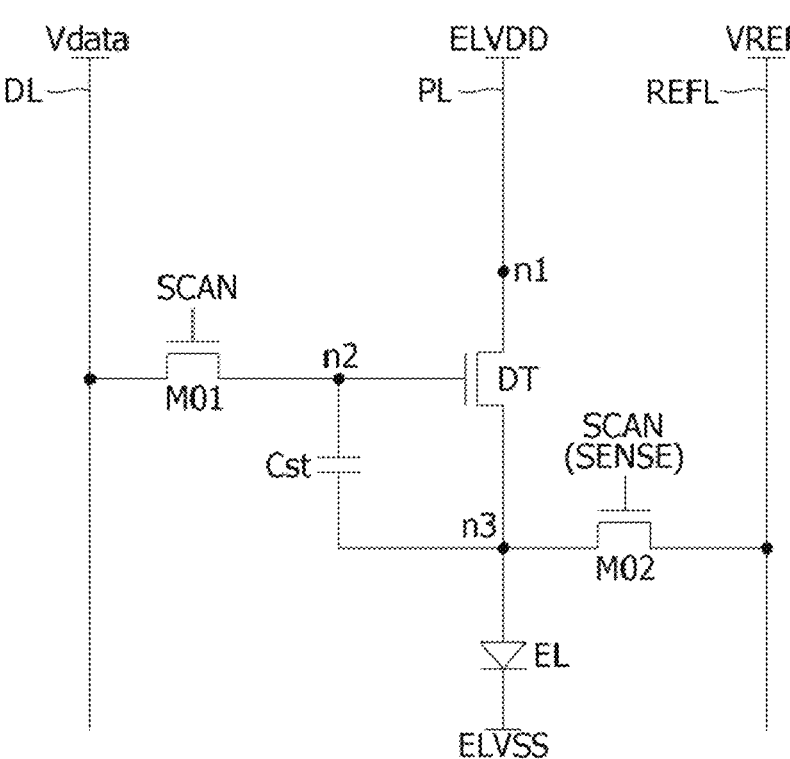
Figure 8:
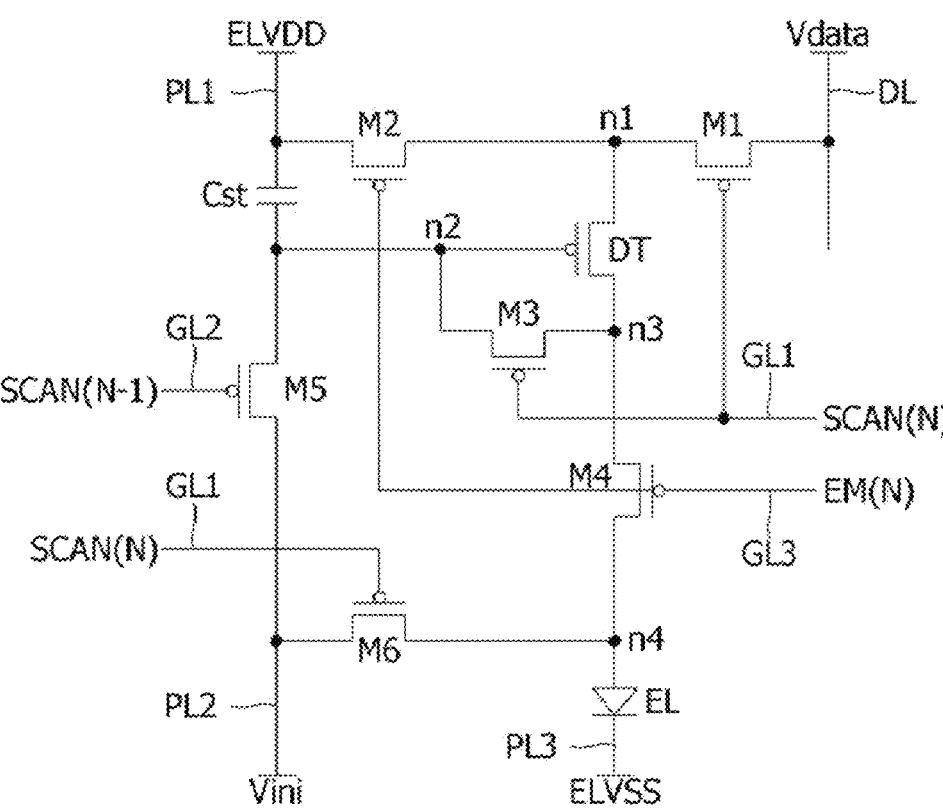

FIGS. 6 to 8 are circuit diagrams illustrating various pixel circuits applicable to any display device of the present disclosure.

In a first example, referring to FIG. 6, the pixel circuit includes a light emitting element EL, a driving element DT configured to supply a current to the light emitting element EL, a switch element M01 configured to connect a data line DL to a second node n2 in response to a scan pulse SCAN, and a capacitor Cst connected between the second node n2 and a third node n3. The driving element DT and the switch element M01 can be implemented as n-channel transistors.

The driving element DT includes a gate electrode connected to the second node n2, a first electrode connected to a first node n1, and a second electrode connected to the third node n3. A VDD line PL to which a pixel driving voltage ELVDD is applied is connected to the first node n1. The light emitting element EL includes an anode connected to the third node n3 and a cathode connected to a VSS line to which a low potential power voltage ELVSS is applied.

The driving element DT drives the light emitting element EL by supplying a current to the light emitting element EL according to the gate-source voltage Vgs. The light emitting element EL is turned on and emits light when a forward voltage between the anode and the cathode is equal to or greater than a threshold voltage. The capacitor Cst is connected between the gate electrode and a source electrode of the driving element DT to maintain the gate-source voltage Vgs of the driving element DT.

FIG. 7 shows a second example of the pixel circuit.

Referring to FIG. 7, in addition to the configuration of the pixel circuit shown in FIG. 6, the pixel circuit further includes a second switch element M02 connected between a reference voltage line REFL and a second electrode of the driving element DT. In this pixel circuit, the driving element DT and the switch elements M01 and M02 can be implemented as n-channel transistors.

The second switch element M02 applies a reference voltage VREF to the third node n3 in response to the scan pulse SCAN or a separate sensing pulse SENSE. The reference voltage VREF is applied to the pixel circuit through the REF line REFL.

In a sensing mode, a current flowing through the channel of the driving element DT or a voltage between the driving element DT and the light emitting element EL can be sensed through the reference line REFL. The current flowing through the reference line REFL is converted into a voltage through an integrator and converted into digital data through an analog-to-digital converter (hereinafter referred to as an "ADC"). This digital data is sensing data including threshold voltage or mobility information of the driving element DT. The sensing data is transmitted to a data operation part. The data operation part can receive the sensing data from the ADC and compensate for driving deviation and deterioration of pixels by adding a compensation value selected based on the sensing data to the pixel data or multiplying the compensation value selected based on the sensing data by the pixel data.

Figure 9:
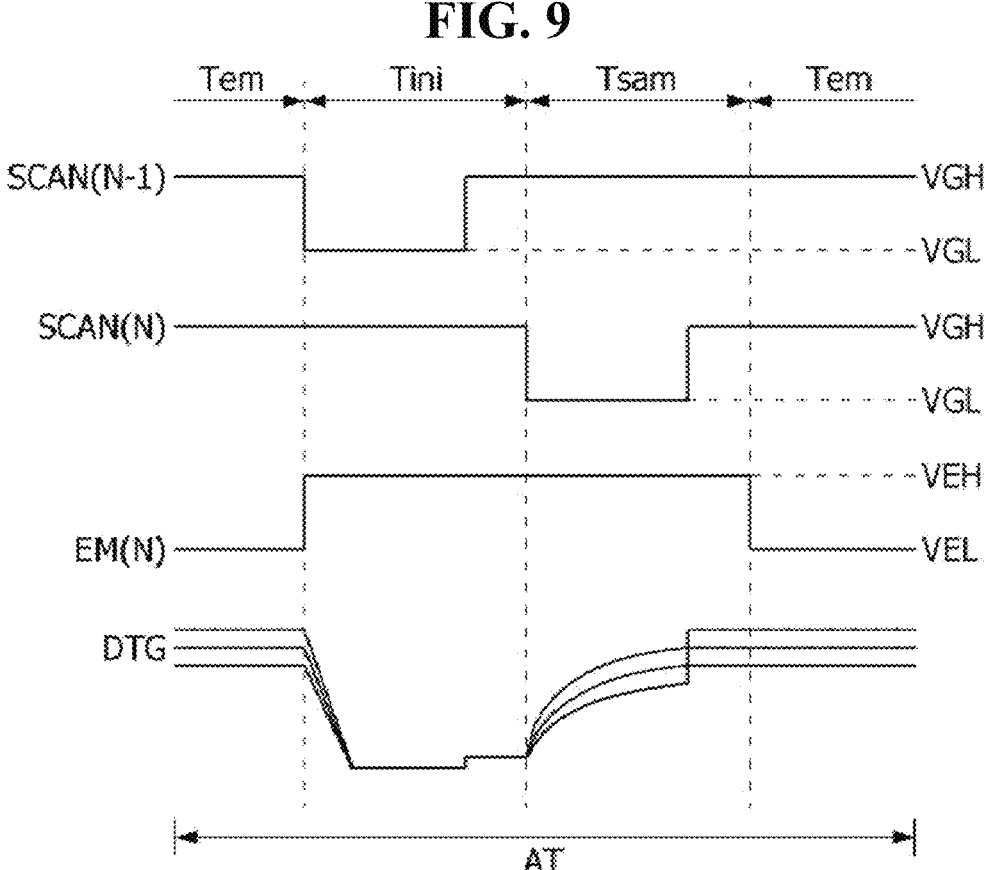
FIG. 9 is a waveform diagram illustrating a method of driving the pixel circuit shown in FIG. 8.

FIG. 8 is a circuit diagram illustrating a third example of the pixel circuit. FIG. 9 is a waveform diagram illustrating a method of driving the pixel circuit shown in FIG. 8.

Referring to FIGS. 8 and 9, the pixel circuit includes a light emitting element EL, a driving element DT configured to supply a current to the light emitting element EL, and a switch circuit configured to switch a voltage applied to the light emitting element EL and the driving element DT.

The switch circuit is connected to power lines PL1, PL2, and PL3 to which a pixel driving voltage ELVDD, a low potential power voltage ELVSS, and an initialization voltage Vini are applied, a data line DL, and gate lines GL1, GL2 and GL3, and switches voltages applied to the light emitting element EL and the driving element DT in response to a gate signal. The gate signal can include scan pulses SCAN(N−1)

and SCAN(N) and an emission control pulse (hereinafter, referred to as an "EM pulse") EM(N). Here, N is a number, e.g., a positive integer.

The switch circuit includes an internal compensation circuit that samples a threshold voltage Vth of the driving element DT using a plurality of switch elements M1 to M6 and stores the voltages in a capacitor Cst, and compensates for the gate voltage of the driving element DT by the threshold voltage Vth of the driving element DT. Each of the driving element DT and the switch elements M1 to M6 can be implemented as a p-channel TFT.

A driving period of the pixel circuit can be divided into an initialization period Tini, a sampling period Tsam, and an emission period Tem, as shown in FIG. 9.

An Nth scan pulse SCAN(N) is generated as a gate-on voltage VGL in the sampling period Tsam and applied to a first gate line GL1. An (N−1)th scan pulse SCAN(N−1) is generated as the gate-on voltage VGL in the initialization period Tini prior to the sampling period and applied to a second gate line GL2. The EM pulse EM(N) is generated as a gate-off voltage VGH in the initialization period Tini and the sampling period Tsam and applied to a third gate line GL3.

During the initialization period Tini, the (N−1)th scan pulse SCAN(N−1) is generated as the gate-on voltage VGL, and each voltage of the Nth scan pulse SCAN(N) and the EM pulse EM(N) is the gate-off voltage VGH. During the sampling period Tsam, the Nth scan pulse SCAN(N) is generated as a pulse of the gate-on voltage VGL, and each voltage of the (N−1)th scan pulse SCAN(N−1) and the EM pulse EM(N) is the gate-off voltage VGH. The EM pulse EM(N) is generated as the gate-on voltage VGL during at least a part of the light emission period Tem, and each voltage of the (N−1)th scan pulse SCAN(N−1) and the Nth scan pulse SCAN (N) is generated as the gate-off voltage VGH.

During the initialization period Tini, the fifth switch element M5 is turned on according to the gate-on voltage VGL of the (N−1)th scan pulse SCAN(N−1) to initialize the pixel circuit. During the sampling period Tsam, the first and second switch elements M1 and M2 are turned on according to the gate-on voltage VGL of the Nth scan pulse SCAN(N) and a data voltage Vdata compensated for by the threshold voltage of the driving element DT is stored in the capacitor Cst. At the same time, the sixth switch element M6 is turned on during the sampling period Tsam, and lowers the voltage of the fourth node n4 to the reference voltage VREF to suppress light emission of the light emitting element EL.

When the light emission period Tem starts, the EM line GL3 is inverted to the gate-on voltage VGL. During the light emission period Tem, the scan lines GL1 and GL2 maintain the gate-off voltage VGH. During the light emission period Tem, since the third and fourth switch elements M3 and M4 are turned on, the light emitting element EL can emit light. During the light emission period Tem, in order to accurately express the luminance of low grayscale, a voltage level of the EM pulse EM(N) can be reversed at a predetermined duty ratio between the gate-on voltage VGL and the gate-off voltage VGH. In this case, the third and fourth switch elements M3 and M4 can repeatedly turn on/off according to the duty ratio of the EM pulse EM(N) during the light emission period Tem.

The anode of the light emitting element EL is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. The cathode of the light-emitting element EL is connected to the VSS line PL3 to which the low potential power supply voltage ELVSS is applied. The light emitting element EL emits light with a current Ids flowing according to a gate-source voltage Vgs of the driving element DT. A current path of the light emitting element EL is switched by the third and fourth switch elements M3 and M4.

The storage capacitor Cst is connected between the VDD line PL1 and the second node n2. The data voltage Vdata compensated by the threshold voltage Vth of the driving element DT is charged in the capacitor Cst. Since the data voltage Vdata in each of the sub-pixels is compensated by the threshold voltage Vth of the driving device DT, the characteristic deviation of the driving device DT in the sub-pixels is compensated.

The first switch element M1 is turned on in response to the gate-on voltage VGL of the Nth scan pulse SCAN(N) to connect the second node n2 to the third node n3. The second node n2 is connected to a gate electrode of the driving element DT, a first electrode of the capacitor Cst, and a first electrode of the first switch element M1. The third node n3 is connected to a second electrode of the driving element DT, a second electrode of the first switch element M1, and a first electrode of the fourth switch element M4. A gate electrode of the first switch element M1 is connected to the Nth scan line GL1 to receive the Nth scan pulse SCAN(N). The first electrode of the first switch element M1 is connected to the second node n2, and the second electrode of the first switch element M1 is connected to the third node n3.

Since the first switch element M1 is turned on during very short one horizontal period (1H) in which the Nth scan signal SCAN(N) is generated as the gate-on voltage VGL in one frame period, a leakage current may occur in an off state. In order to restrain the leakage current of the first switch element M1, the first switch element M1 can be implemented with a transistor having a dual gate structure in which two transistors are connected in series.

The second switch element M2 is turned on in response to the gate-on voltage VGL of the Nth scan pulse SCAN(N) to supply the data voltage Vdata to the first node n1. A gate electrode of the second switch element M2 is connected to the Nth scan line GL1 to receive the Nth scan pulse SCAN(N). A first electrode of the second switch element M2 is connected to the first node n1. The second electrode of the second switch element M2 is connected to the data lines DL of the first region DA to which the data voltage Vdata is applied. The first node n1 is connected to the first electrode of the second switch element M2, a second electrode of the third switch element M3, and a first electrode of the driving element DT The third switch element M3 is turned on in response to the gate-on voltage VGL of the EM pulse EM(N) to connect the VDD line PL1 to the first node n1. A gate electrode of the third switch element M3 is connected to the EM line GL3 to receive the EM pulse EM(N). A first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to connect the third node n3 to the anode of the light emitting element OLED. A gate electrode of the fourth switch element M4 is connected to the EM line GL3 to receive the EM pulse EM(N). The first electrode of the fourth switch element M4 is connected to the third node n3, and the second electrode is connected to the fourth node n4.

The fifth switch element M5 is turned on in response to the gate-on voltage VGL of the N−1th scan pulse SCAN (N−1) to connect the second node n2 to the Vini line PL2. A gate electrode of the fifth switch element M5 is connected to the N−1th scan line GL2 to receive the N−1th scan pulse SCAN(N−1). A first electrode of the fifth switch element M5 is connected to the second node n2, and a second electrode is connected to the Vini line PL2. In order to restrain the leakage current of the fifth switch element M5, the fifth switch element M5 is implemented with a transistor having a dual gate structure in which two transistors are connected in series.

The sixth switch element M6 is turned on in response to the gate-on voltage VGL of the Nth scan pulse SCAN(N) to connect the Vini line PL2 to the fourth node n4. A gate electrode of the sixth switch element M6 is connected to the Nth scan line GL1 to receive the Nth scan pulse SCAN(N). A first electrode of the sixth switch element M6 is connected to the Vini line PL2, and a second electrode of the sixth switch element M6 is connected to the fourth node n4.

In another embodiment, the gate electrodes of the fifth and sixth switch elements M5 and M6 can be commonly connected to the N−1th scan line GL2 to which the N−1th scan pulse SCAN(N−1) is applied. In this case, the fifth and sixth switch elements M5 and M6 can be simultaneously turned on in response to the N−1th scan pulse SCAN(N−1).

The driving element DT drives the light emitting element EL by controlling the current flowing through the light emitting element EL according to the gate-source voltage Vgs. The driving element DT includes the gate connected to the second node n2, the first electrode connected to the first node n1, and the second electrode connected to the third node n3. In FIG. 9 , "DTG" is the gate voltage of the driving element DT, that is, the voltage of the second node n2.

It should be noted that the configuration of the pixel circuit present in the display devices of the present disclosure is not limited to the examples of FIGS. 6 to 8. For example, the data voltage Vdata can be applied to the gate electrode of the driving element DT or applied to the first electrode or the second electrode of the driving element DT. The gamma characteristic curve of the data voltage Vdata can be set as a positive gamma curve or an inverse gamma curve according to the channel characteristic of the driving element DT or an electrode to which the data voltage Vdata is applied. The data voltage Vdata can be applied to the first electrode or the second electrode of the n-channel driving element DT or the data voltage Vdata can be applied to the gate electrode of the p-channel driving element DT. The data voltage Vdata applied to the gate electrode of the n-channel driving element DT is a voltage determined by the positive gamma curve. The data voltage Vdata applied to the first electrode or the second electrode of the n-channel driving element DT is a voltage determined by the inverse gamma curve. The data voltage Vdata applied to the gate electrode of the p-channel driving element DT is a voltage determined by the inverse gamma curve. The data voltage Vdata applied to the first electrode or the second electrode of the p-channel driving element DT is a voltage determined by the positive gamma curve.

Figure 10:
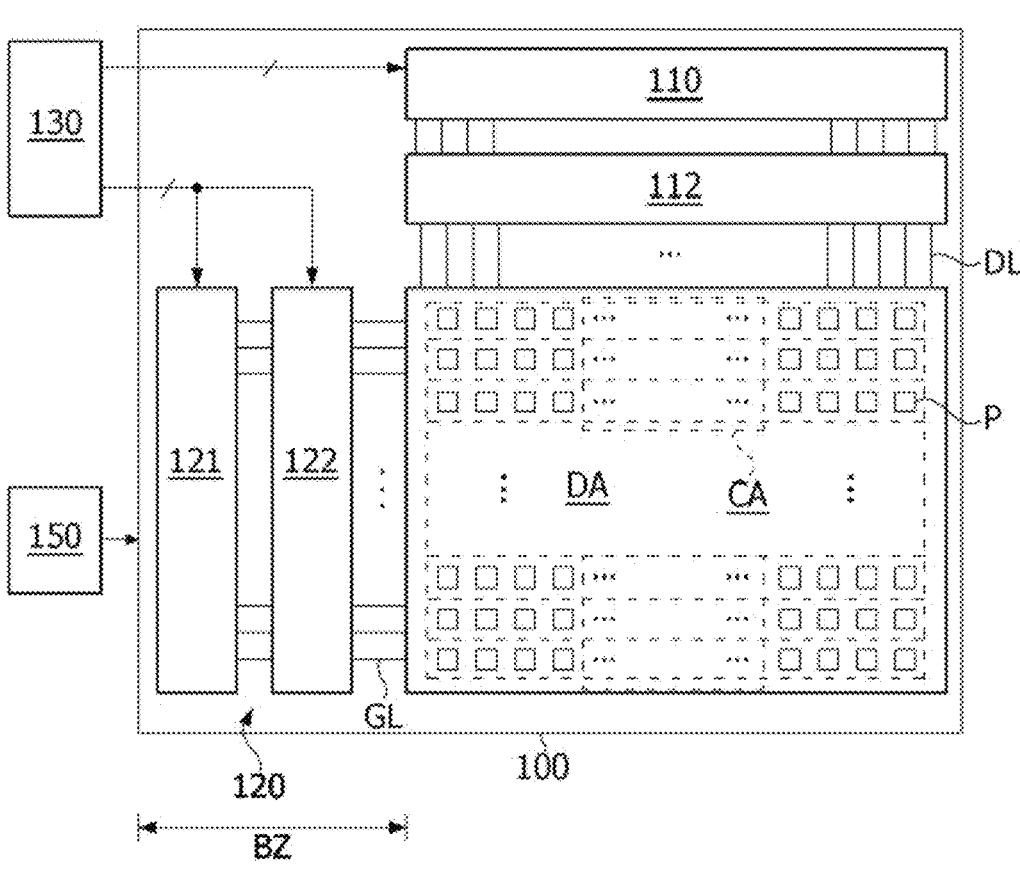
FIG. 10 is a block diagram illustrating the display device according to an exemplary embodiment of the present disclosure.
Figure 10:
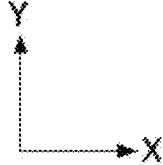
Figure 11:
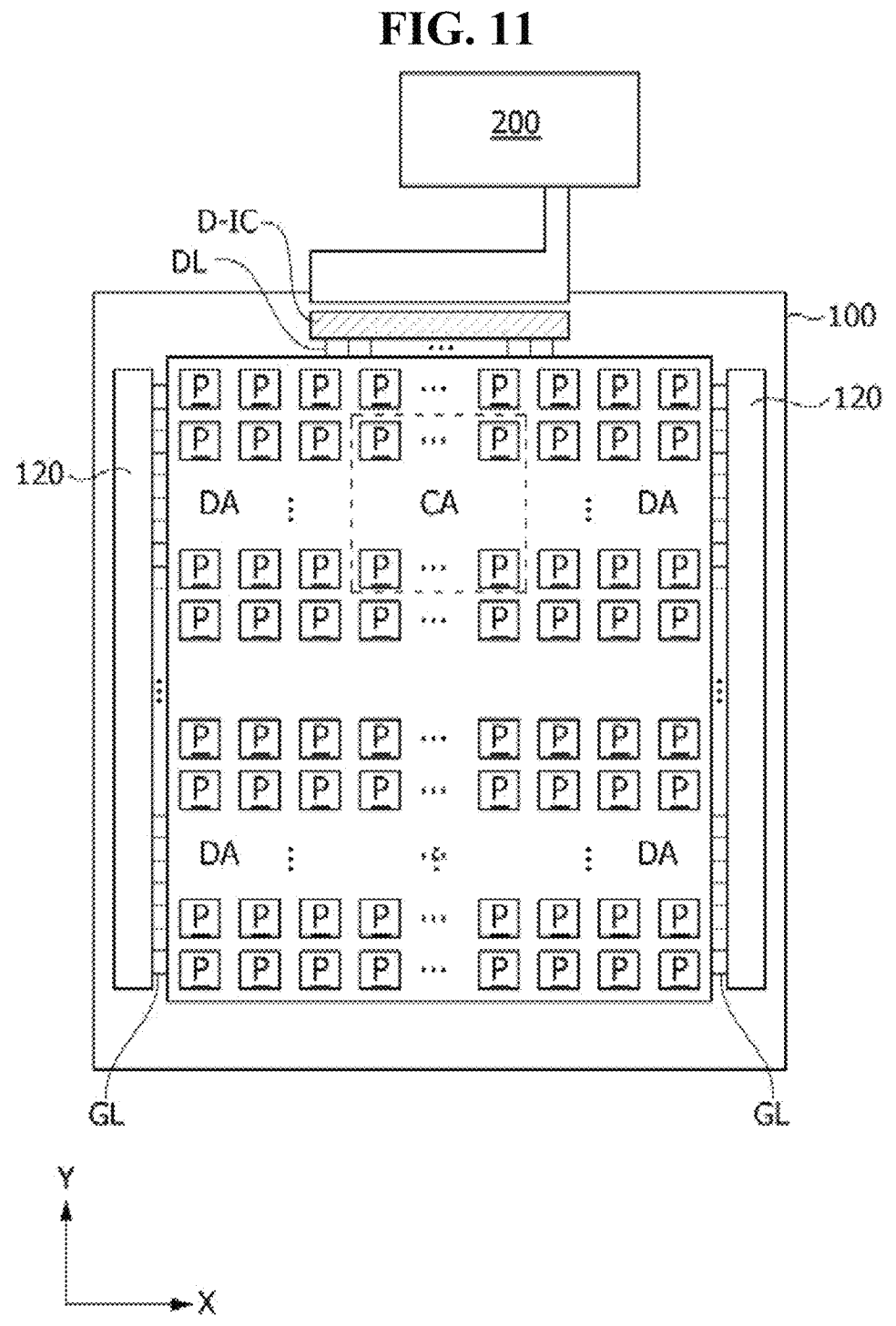

FIG. 10 is a block diagram illustrating a display device according to an exemplary embodiment of the present disclosure. FIG. 11 is a view illustrating an example in which the display device according to an embodiment of the present disclosure is applied to a mobile device.

Referring to FIG. 10, a display device according to this embodiment of the present disclosure includes a display panel 100, display panel drivers 110 and 120 configured to write pixel data of an input image to pixels P of the display panel 100, a timing controller 130 configured to control the display panel drivers 110, 120, and a power supply unit 150 configured to generate power need to drive the display panel 100.

The display panel 100 includes a pixel array that displays an input image on a screen. As described above, the pixel array can be divided into a first pixel area DA and a second pixel area CA. Each of the sub-pixels of the pixel array in the display panel 100 can drive the light emitting element EL using the pixel circuit shown in FIGS. 6 to 8. As a variation, the pixel array can include one or more first pixel areas DAs and one or more second pixel areas CAs.

Touch sensors can be disposed on the screen of the display panel 100. The touch sensors can be implemented as on-cell type or add-on type touch sensors disposed on the screen of the display panel or can be implemented as in-cell type touch sensors embedded in the pixel array.

The display panel 100 can be implemented as a flexible display panel in which the pixels P are disposed on a flexible substrate such as a plastic substrate or a metal substrate. In the flexible display, the size and shape of the screen can be changed by winding, folding, or bending the flexible display panel. The flexible display can include a slidable display, a rollable display, a bendable display, a foldable display, etc.

The display panel drivers reproduce the input image on the screen of the display panel 100 by writing the pixel data of the input image to the sub-pixels. The display panel drivers include the data driver 110 and the gate driver 120. The display panel drivers can further include a demulti-plexer 112 disposed between the data driver 110 and data lines DL.

Each display panel driver can operate in a low-speed driving mode under the control of the timing controller 130. In the low-speed driving mode, power consumption of the display device can be reduced when the input image does not change for a preset time by analyzing the input image. In the low-speed driving mode, when a still image is input for a predetermined time or longer, power consumption can be reduced by lowering a refresh rate of the pixels P and controlling the data writing period of the pixels P to be longer. The low-speed driving mode is not limited when the still image is input. For example, when the display device operates in a standby mode or when a user command or an input image is not input to the display panel driving circuit for a predetermined time or more, the display panel driving circuit can operate in the low-speed driving mode.

The data driver 110 generates the data voltage Vdata using a digital-to-analog converter (hereinafter referred to as a "DAC") for pixel data of an input image, which is digital data. The DAC receives pixel data, which is digital data, and receives a gamma voltage from a gamma voltage generating circuit of the power supply unit 150. The DAC is disposed in each of the channels of the data driver 110. The DAC converts the pixel data into the data voltage Vdata using an array of switch elements that select a voltage in response to a bit of the pixel data. The data voltage output from each of the channels of the data driver 110 can be supplied to the data lines DL of the display panel 100 through the demul-tiplexer 112.

The demultiplexer 112 time-divides and distributes the data voltage Vdata output through the channels of the data driver 110 to the plurality of data lines DL. The number of channels of the data driver 110 can be reduced due to the demultiplexer 112. The demultiplexer 112 can be omitted. In this case, the channels of the data driver 110 are directly connected to the data lines DL.

The gate driver 120 can be implemented as a gate in panel (GIP) circuit that is directly formed on a bezel region BZ of the display panel 100 together with a TFT array of the pixel array. The gate driver 120 outputs gate signals to gate lines GL under the control of the timing controller 130. The gate driver 120 can sequentially supply the gate signals to the gate lines GL by shifting the gate signals using a shift register. The voltage of the gate signal swings between the gate-off voltage VGH and the gate-on voltage VGL. The gate signal can include the scan pulse, the EM pulse, the sensing pulse, etc., shown in FIGS. 6 to 8.

The gate driver 120 can be disposed on each of the left and right bezels (or two opposite sides) of the display panel 100 to supply the gate signal to the gate lines GL in a double feeding method. In the double feeding method, the gate drivers 120 on both sides are synchronized so that the gate signals can be simultaneously applied from both ends of one gate line. In another exemplary embodiment, the gate driver 120 can be disposed on any one of the left and right bezels (or two opposite sides) of the display panel 100 and can supply the gate signals to the gate lines GL in a single feeding method.

The gate driver 120 can include a first gate driver 121 and a second gate driver 122. The first gate driver 121 outputs the scan pulse and the sensing pulse, and shifts the scan pulse and the sensing pulse according to the shift clock. The second gate driver 122 outputs a pulse of the EM signal and shifts the EM pulse according to the shift clock. In the case of the bezel-free model, at least some of the switch elements composing the first and second gate drivers 121 and 122 can be dispersedly disposed in the pixel array.

The timing controller 130 receives pixel data of an input image and a timing signal synchronized with the pixel data from the host system. The timing signal includes a vertical synchronization signal Vsync, a horizontal synchronization signal Hsync, a clock CLK, a data enable signal DE, etc. One period of the vertical synchronization signal Vsync is one frame period. One period of each of the horizontal synchronization signal Hsync and the data enable signal DE is one horizontal period 1H. The pulse of the data enable signal DE is synchronized with one-line data to be written to the pixels P of one pixel line. Since the frame period and the horizontal period can be known by counting the data enable signal DE, the vertical synchronization signal Vsync and the horizontal synchronization signal Hsync may be omitted.

The timing controller 130 transmits the pixel data of the input image to the data driver 110, and synchronizes the data driver 110, the demultiplexer 112, and the gate driver 120. The timing controller 130 can include a data operator that receives sensing data obtained from the pixels P in the display panel driver to which the external compensation technology is applied and modulates the pixel data. In this case, the timing controller 130 can transmit the pixel data modulated by the data operator to the data driver 110.

The timing controller 130 can control the operation timing of the display panel drivers 110, 112, and 120 at a frame frequency of an input frame frequency×i Hz (i is a positive integer greater than 0) by multiplying the input frame frequency by i times. The input frame frequency is 60 Hz in the National Television Standards Committee (NTSC) scheme and 50 Hz in the Phase-Alternating Line (PAL) scheme. The timing controller 130 can lower the frame frequency to a frequency between 1 Hz and 30 Hz to lower the refresh rate of the pixels P in the low-speed driving mode.

The timing controller 130 generates a data timing control signal for controlling the operation timing of the data driver 110, a switch control signal for controlling the operation timing of the demultiplexer 112, and a gate timing control signal for controlling the operation timing of the gate driver 120 based on the timing signals Vsync, Hsync, and DE received from the host system.

The gate timing signal can include a start pulse, a shift clock, etc. A voltage level of the gate timing control signal output from the timing controller 130 can be converted into a gate high voltage VGH/VEH and a gate low voltage VGL/VEL through a level shifter omitted from the drawing and supplied to the gate driver 120. The level shifter can convert a low level voltage of the gate timing control signal into the gate low voltage VGL, and convert a high level voltage of the gate timing control signal into the gate high voltage VGH/VEH.

The power supply unit 150 can include a charge pump, a regulator, a buck converter, a boost converter, a gamma voltage generating circuit, etc. The power supply unit 150 generates power required to drive the display panel driver and the display panel 100 by adjusting a DC input voltage from the host system. The power supply unit 150 can output DC voltages such as a gamma reference voltage, the gate-off voltage VGH/VEH, the gate-on voltage VGL/VEL, a pixel driving voltage ELVDD, a low-potential power voltage ELVSS, an initialization voltage Vini, and a reference voltage VREF. The gamma voltage generating circuit can be implemented as a programmable gamma IC (P-GMA IC). The programmable gamma IC can vary the gamma voltage according to a register setting value. The gamma voltage is supplied to the data driver 110. The gate-off voltage VGH/VEH and the gate-on voltage VGL/VEL are supplied to the level shifter and the gate driver 120. The pixel driving voltage ELVDD, the low potential power voltage ELVSS, the initialization voltage Vini, and the reference voltage VREF are commonly supplied to the pixel circuits through power lines. The pixel driving voltage ELVDD is set to a voltage higher than the low potential power voltage ELVSS, the initialization voltage Vini, and the reference voltage VREF.

The host system can be a main circuit board of a TV (Television) system, a set-top box, a navigation system, a personal computer (PC), a vehicle system, a home theater system, a mobile device, or a wearable device. In the mobile device or wearable device, the timing controller 130, the data driver 110, and the power supply unit 150 can be integrated into one drive integrated circuit (Drive IC, D-IC) in the display panel of the mobile terminal as shown in FIG. 11. In FIG. 11, reference numeral 200 denotes the host system. The host system 200 includes an authentication module. The authentication module includes circuitry, programs and/or processor(s) for executing a facial recognition algorithm that processes user authentication by comparing the facial pattern data received from the infrared camera 202 with preset feature points of the user's facial pattern.

Figures 12, 13:
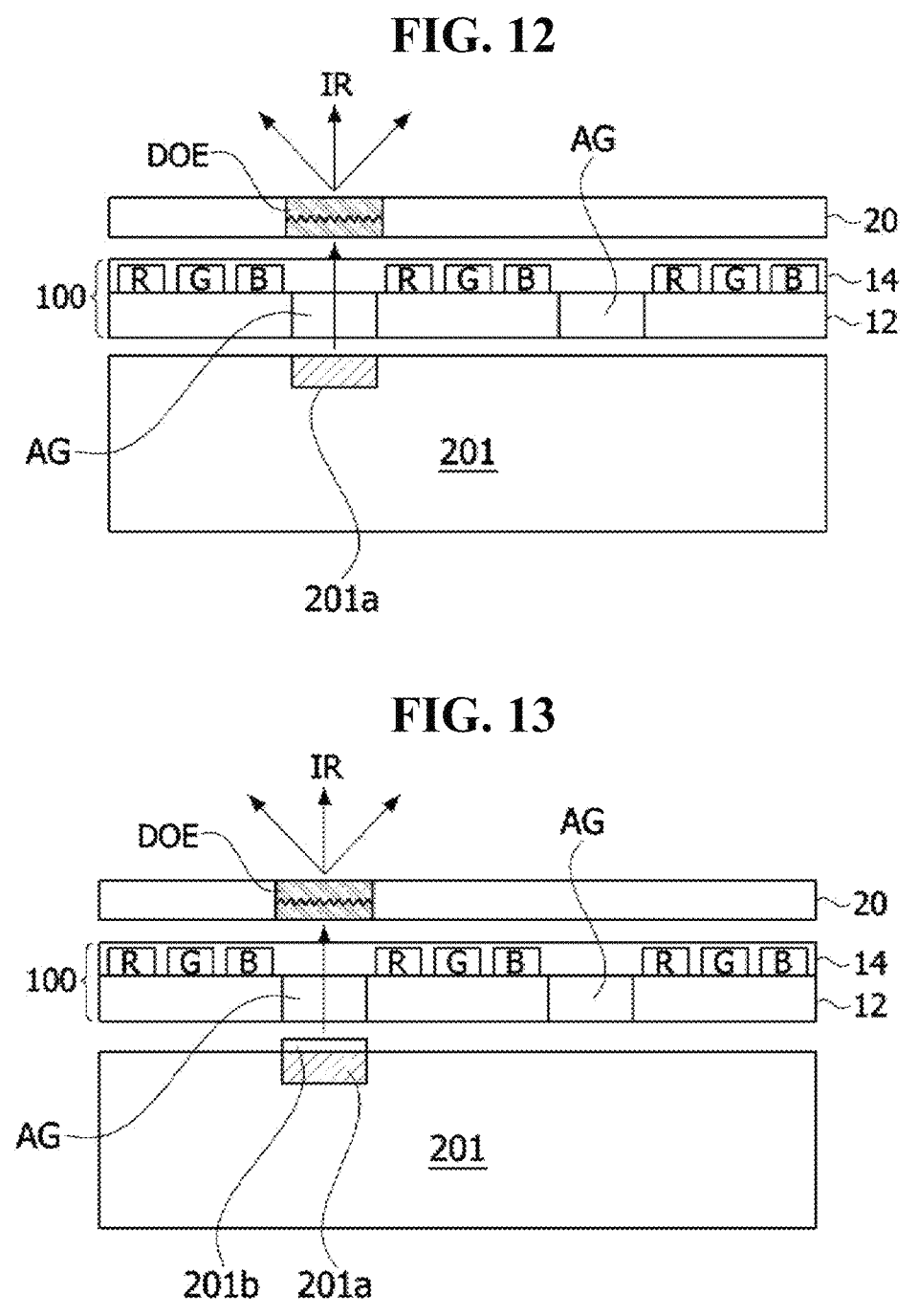

FIG. 12 is a cross-sectional view illustrating a display device according to a first exemplary embodiment of the present disclosure. FIG. 13 is a cross-sectional view illustrating a display device according to a second exemplary embodiment of the present disclosure.

Referring to FIGS. 12 and 13, the cover glass 20 can include one or more diffraction patterns DOE disposed at a position facing the light transmitting part AG of the second pixel area CA. The diffraction pattern DOE is a diffractive optical element that separates infrared light IR into a plurality of dot beams.

An emitter 201a of an infrared light source 201 can be disposed under the light transmitting part AG of the second pixel area CA and can irradiate the infrared light IR to the second pixel area CA. The infrared light source 201 can be implemented as an optical module/device without a light guide and a lens, but is not limited thereto. The infrared light IR emitted from the infrared light source 201 can be incident at an angle perpendicular to the XY plane of the display panel 100 and the cover glass 20 in order to increase the diffraction efficiency of the diffraction pattern DOE. To this end, as shown in FIG. 13, a collimating lens 201b can be disposed on a light exit surface of the emitter 201a of the infrared light source (optical device).

The diffraction pattern DOE separates the infrared light IR incident through the light transmitting part AG of the second pixel area CA into a plurality of dot beams.

When the diffractive optical element 203 overlaps pixels under the display panel 100, the dot beams passing through the diffractive optical element 203 are masked by the pixel circuit and metal wirings, so that the face recognition rate may be reduced. The diffractive optical element 203 of the present disclosure is disposed in the light transmitting part AG without a metal layer and a semiconductor layer, and the dot beams passing through the diffractive optical element 203 are projected in the front of the display panel 100 without interference or masking, so that the transmittance of the infrared light IR for face recognition can be improved.

The emitter 201a of the infrared light source 201 and the diffraction pattern DOE can be disposed in one light transmitting part AG in the second pixel area CA in the display device of FIGS. 12 and 13.

Figure 14A:
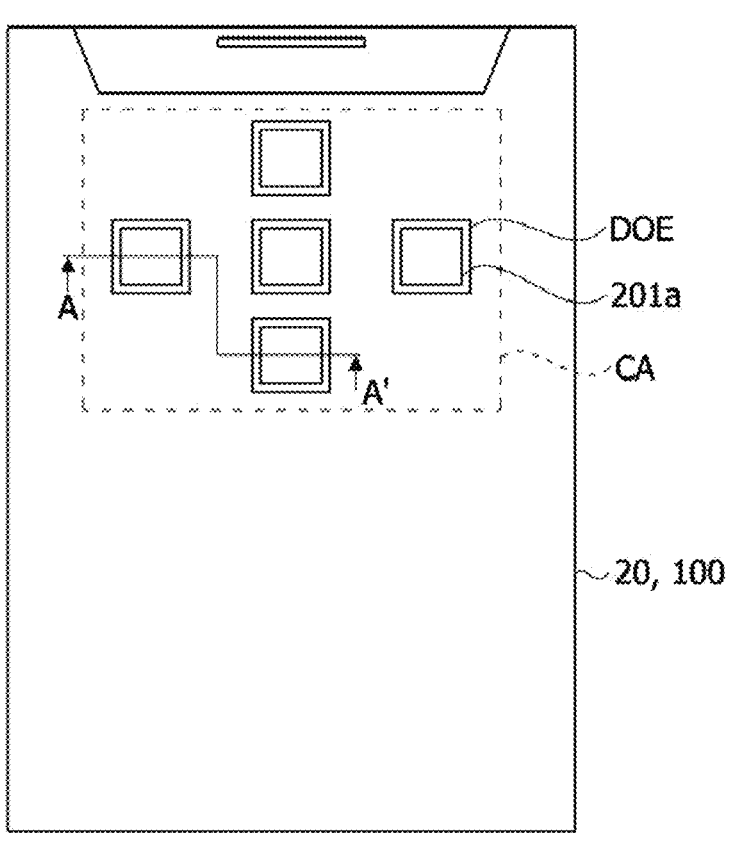
FIG. 14A is a plan view illustrating an example in which a plurality of diffractive optical elements are dispersedly disposed on a cover glass of a mobile terminal.
Figure 14B:
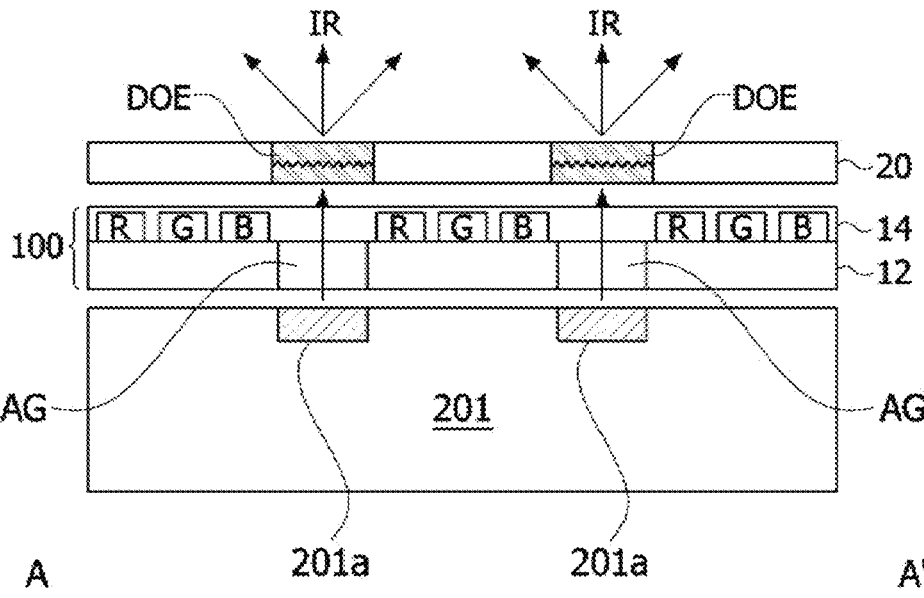
FIG. 14B is a cross-sectional view taken along line "A-A'" in FIG. 14A.

FIG. 14A is a plan view illustrating an example in which a plurality of diffractive optical elements are dispersedly disposed on a cover glass of a mobile terminal, and FIG. 14B is a cross-sectional view taken along line "A-A'" in FIG. 14A. Further, FIG. 15A is a plan view illustrating an example in which a wide diffractive optical element is disposed on a cover glass of a mobile terminal, and FIG. 15B is a cross-sectional view taken along line "B-B'" in FIG. 15A.

As shown in FIGS. 14A to 15B, a plurality of emitters 201a of the infrared light sources 201 and a plurality of diffraction patterns DOE can be disposed in the second pixel area CA of the display device to increase the diffraction efficiency of the diffractive optical element 203 and to project the dot beams more widely. The optical module (optical device) can include a plurality of emitters 201a disposed in an array form. Each of the emitters 201a can be driven by the infrared light source 201. In this case, the plurality of diffraction patterns DOE are spaced apart at a predetermined interval in the cover glass 20 and face each of the light transmitting parts AG, and each of the emitters 201a of the optical module can be disposed under the rear surface of the display panel 100 to face each of the light transmitting parts AG.

Referring to FIGS. 14A and 14B, the diffraction patterns DOE can be disposed one by one on the light transmitting parts AG of the second pixel area CA. The emitters 201a of the infrared light source 201 can be matched one-to-one with the diffractive optical element 203 and disposed under the rear surface of the display panel 100 to face the light transmitting parts AG of the second pixel area CA.

Figure 15A:
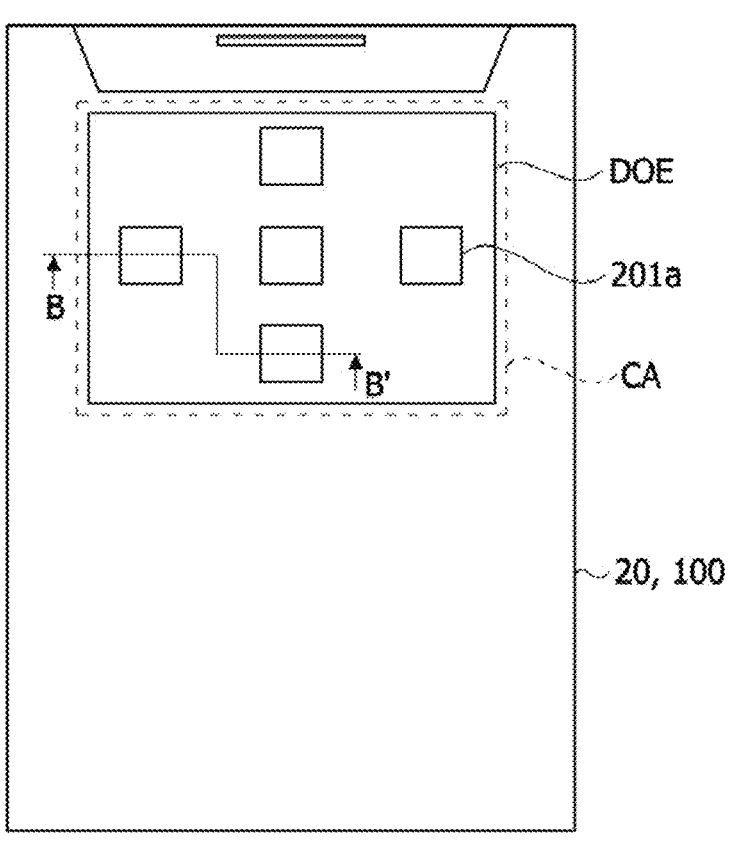
FIG. 15A is a plan view illustrating an example in which a wide diffractive optical element is disposed on a cover glass of a mobile terminal.
Figure 15B:
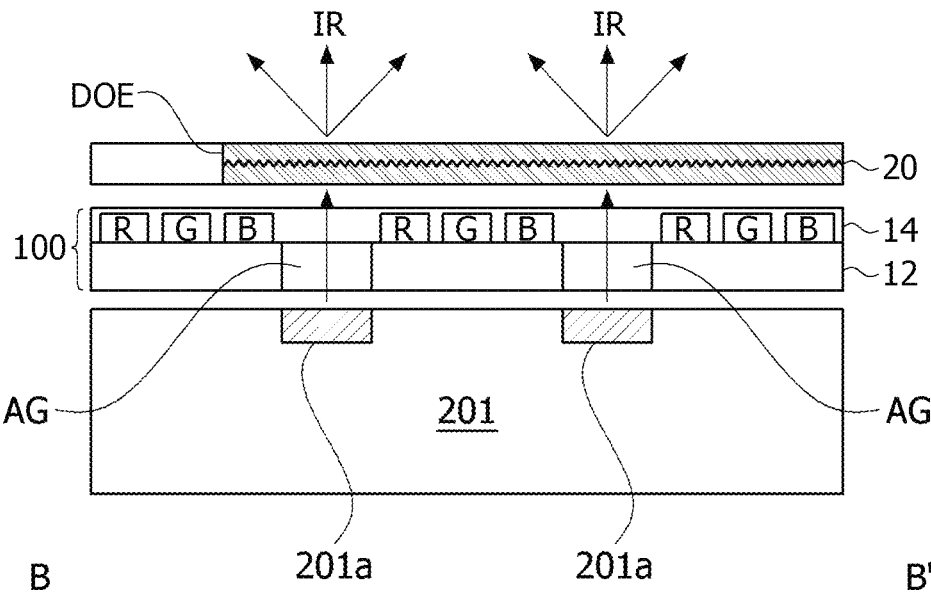
FIG. 15B is a cross-sectional view taken along line "B-B'" in FIG. 15A.

In another example, as shown in FIGS. 15A and 15B, the diffraction patterns DOE can be widely extended and formed in the second pixel area CA and can overlap the pixel and the light transmitting part AG of the second pixel area CA. Accordingly, the diffraction pattern DOE can be patterned on the cover glass 20 to match the size of the emitter 201a of the infrared light source 201 or can be patterned in or on the cover glass 20 with a wide size facing two or more emitters 201a spaced apart from each other by a predetermined interval. A collimating lens (e.g., 201b in FIG. 13) can be disposed in or on each of the emitters 201a of the infrared light source 201 in FIGS. 14A to 15B.

Figure 16:
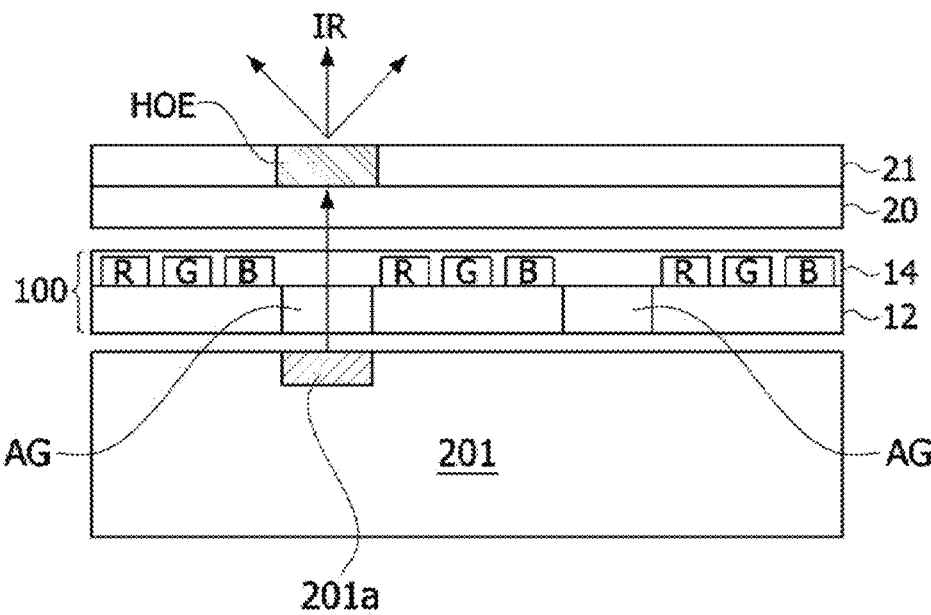
FIG. 16 is a cross-sectional view illustrating a display device according to a third exemplary embodiment of the present disclosure.
Figure 17:
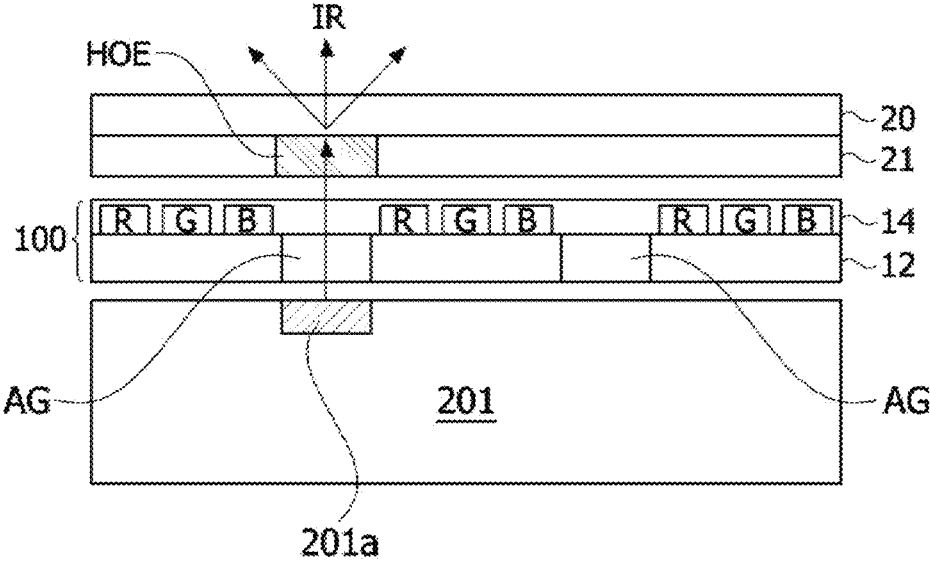
FIG. 17 is a cross-sectional view illustrating a display device according to a fourth exemplary embodiment of the present disclosure.
Figure 18:
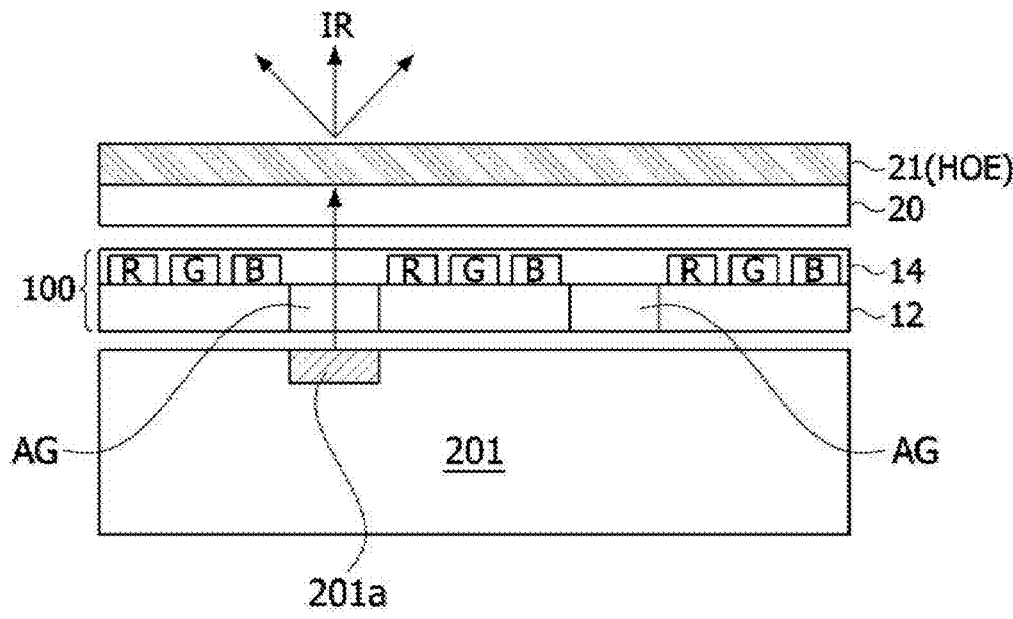
FIG. 18 is a cross-sectional view illustrating a display device according to a fifth exemplary embodiment of the present disclosure.

FIG. 16 is a cross-sectional view illustrating a display device according to a third exemplary embodiment of the present disclosure. FIG. 17 is a cross-sectional view illustrating a display device according to a fourth exemplary embodiment of the present disclosure. FIG. 18 is a cross-sectional view illustrating a display device according to a fifth exemplary embodiment of the present disclosure.

Referring to FIGS. 16 to 18, a hologram film 21 can be adhered to the front or rear surface of the cover glass 20 of the display device. The hologram film 21 can include one or more hologram diffraction patterns HOE recorded at a position facing the light transmitting part AG of the second pixel area CA. The hologram diffraction pattern HOE is formed on the hologram film 21 by a transmission-type recording method and separates the infrared light IR incident through the light transmitting part AG into a plurality of dot beams. The hologram film 21 can be disposed on the cover glass 20 as shown in FIG. 16 or can be disposed under the cover glass as shown in FIG. 17. The emitter 201a of the infrared light source 201 is disposed under the rear surface of the display panel 100 to face the light transmitting part AG. The infrared light IR can be incident on a recording surface of the hologram diffraction pattern at an angle perpendicular to the planes of the display panel 100 and the cover glass 20.

In still another example, the holographic diffraction pattern HOE of the hologram film 21 can be disposed on the cover glass 20 and can cover one or more pixels and one or more light transmitting parts AG as illustrated in FIG. 18. Each of the emitters 201a of the infrared light source 201 is disposed under the rear surface of the display panel 100 to face the light transmitting parts AG, respectively.

In FIGS. 16 to 18, a collimating lens (e.g., 201b in FIG. 13) can be disposed in or on each of the emitters 201a of the infrared light source 201.

Figure 19A:
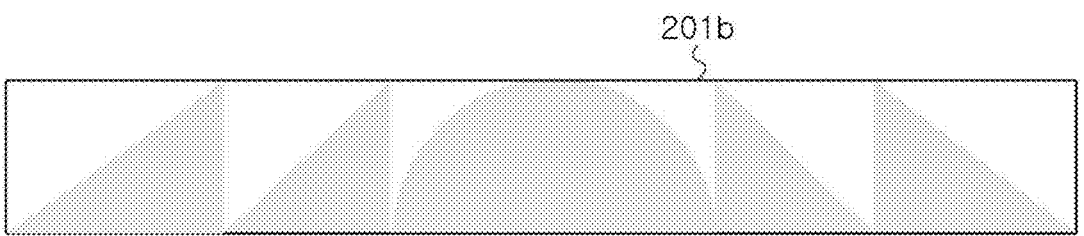
FIGS. 19A and 19B are views illustrating examples of a collimating lens shown in FIG. 13 in detail.
Figure 19B:
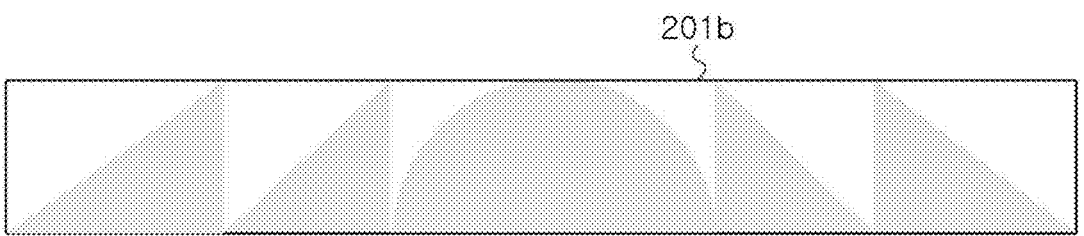

The collimating lens 201b shown in FIG. 13 can be implemented as a Fresnel lens as shown in FIG. 19A or a Gradient Index (GRIN) lens as shown in FIG. 19B. In the GRIN lens, a refractive index changes gradually.

Figure 20:
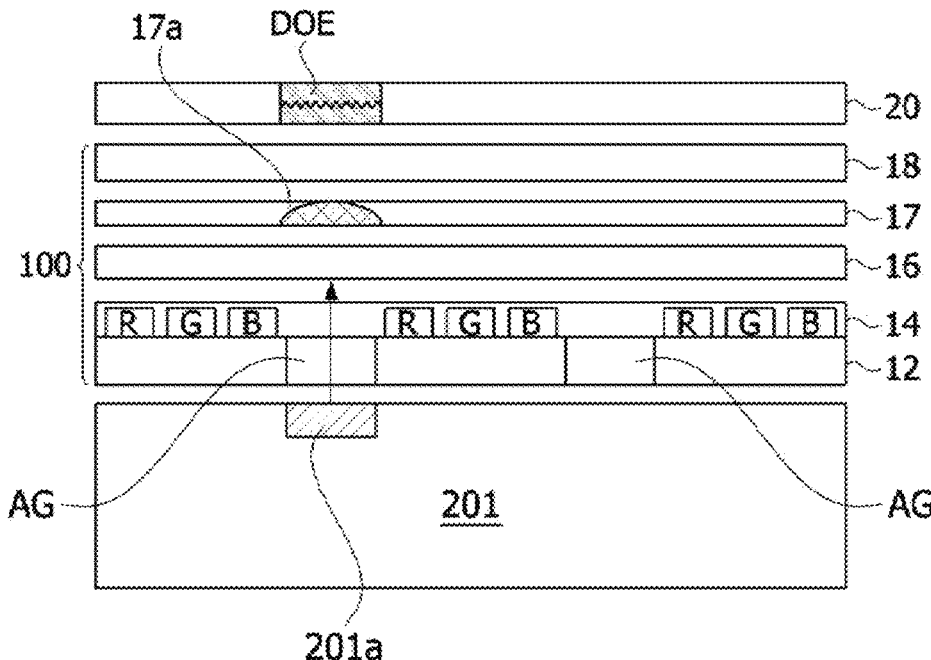
FIG. 20 is a cross-sectional view illustrating an example in which a lens is disposed on a display panel.

Meanwhile, in order to increase the diffraction efficiency of the diffraction patterns DOE and HOE, a lens layer 17 can be disposed on the display panel 100 as shown in FIG. 20. The lens layer 17 can include a collimating lens 17a formed at a position facing the light transmitting part AG of the second pixel area CA. The lens layer 17 can be formed between the polarizing plate 18 and a touch sensor layer 16. In FIG. 20, instead of the diffraction pattern DOE, the hologram diffraction pattern HOE can be adhered to the cover glass 20.

Figure 21:
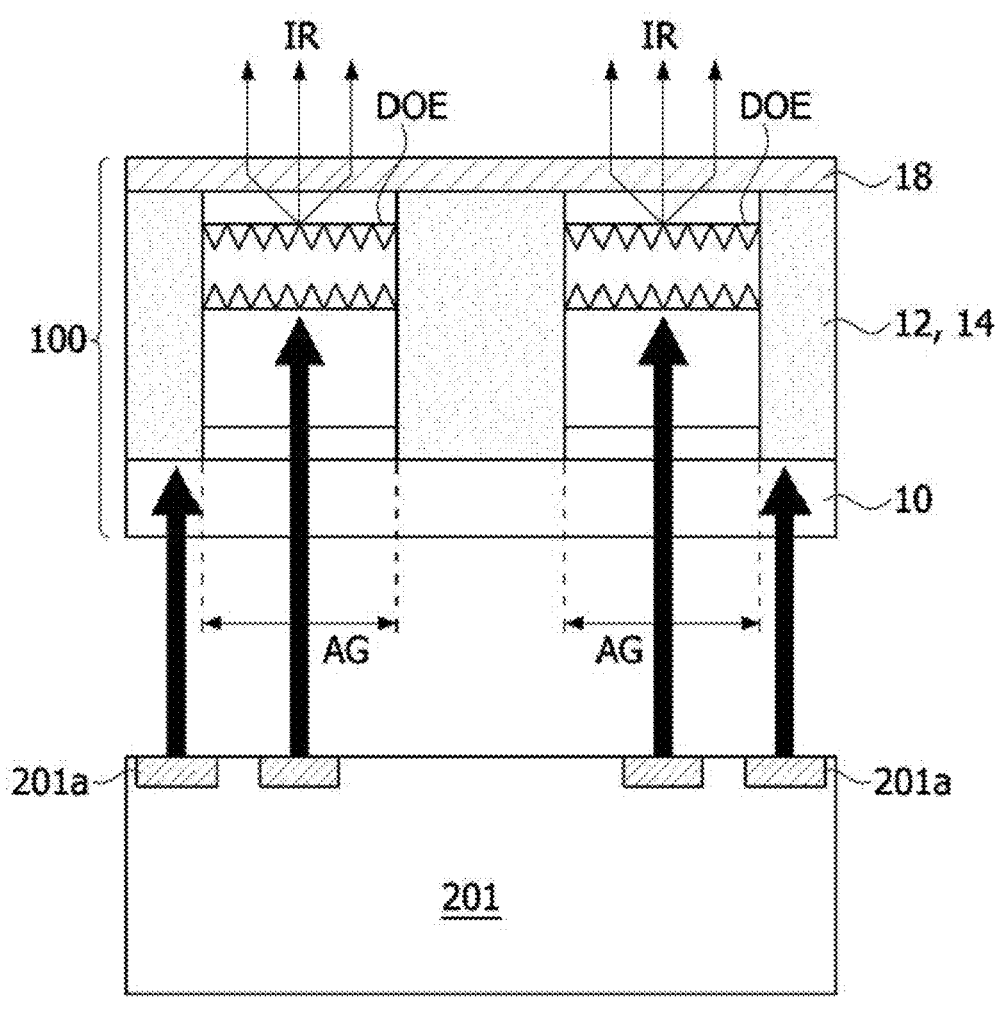
FIG. 21 is a cross-sectional view illustrating a display device according to a sixth exemplary embodiment of the present disclosure.

FIG. 21 is a cross-sectional view illustrating a display device according to a sixth exemplary embodiment of the present disclosure.

Referring to FIG. 21, a diffraction pattern DOE can be formed in at least one of the light transmitting parts AG of the second pixel area CA in the display panel 100.

The diffraction pattern DOE can be embedded in the light transmitting part AG of the display panel 100 by patterning a thin film layer formed on the circuit layer 12 or the light emitting element layer 14 of the display panel 100. For example, the diffraction pattern DOE can be embedded in the light transmitting part AG without adding a manufacturing process of the display panel 100 using a method of patterning any one of a cathode and an anode of the light emitting element or patterning an interface between layers having different refractive indices such as a semiconductor layer or an insulating layer. In another exemplary embodiment, the diffraction pattern DOE can be embedded in the light transmitting part AG using a method in which a separate diffractive optical element 203 having a diffraction pattern DOE formed therein is inserted into the light transmitting part AG in the manufacturing process of the display panel 100.

A plurality of emitters 201a of the infrared light source 201 can be disposed under the light transmitting part AG of the second pixel area CA to irradiate infrared light IR to the second pixel area CA. The infrared light source 201 can be implemented as an optical module/device without a light guide and a lens, but is not limited thereto. The infrared light IR emitted from the infrared light source 201 can be incident at an angle perpendicular to the XY plane of the display panel 100 in order to increase the diffraction efficiency of the diffraction pattern DOE.

The diffraction pattern DOE separates the infrared light IR incident through the light transmitting part AG of the second pixel area CA into a plurality of dot beams. In FIG. 21, the infrared light IR passing through the diffraction pattern DOE propagates to the outside through the polarizing plate 18, but is not limited thereto. For example, a color filter can be positioned instead of the polarizing plate 18, and the polarizing plate 18 can be removed, e.g., the polarizing plate 18 can be removed only from the light transmitting part AG.

In another exemplary embodiment, instead of the diffraction pattern DOE, the hologram diffraction pattern HOE can be embedded in the light transmitting part AG, e.g., in the examples of FIGS. 21-24.

When the diffractive optical element 203 overlaps pixels under the display panel 100, the dot beams passing through the diffractive optical element 203 are masked by the pixel circuit and metal wirings, so that the face recognition rate may be reduced. The diffractive optical element 203 of the present disclosure is disposed in the light transmitting part AG without a metal layer and a semiconductor layer, and the dot beams passing through the diffractive optical element 203 are projected in the front of the display panel 100 without interference or masking, so that the transmittance of the infrared light IR for face recognition can be improved.

Figure 22:
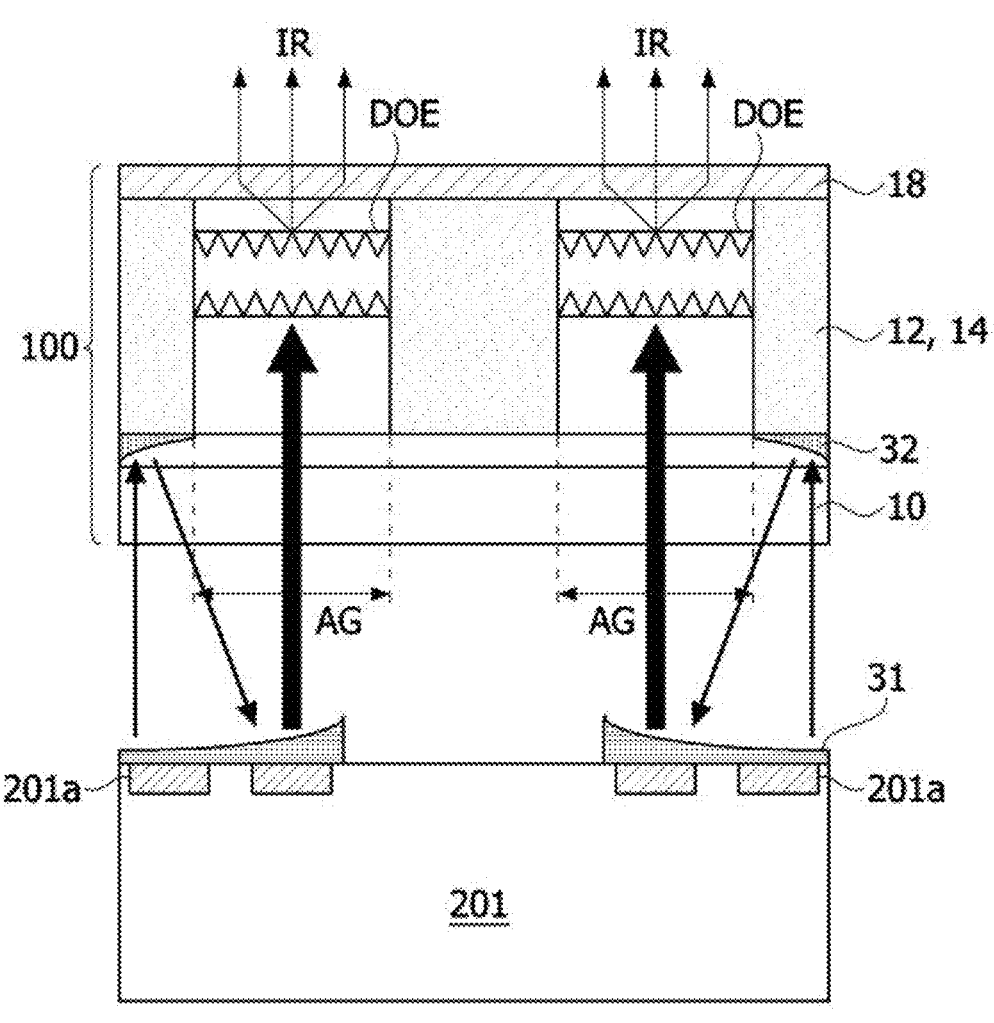
FIG. 22 is a cross-sectional view illustrating a display device according to a seventh exemplary embodiment of the present disclosure.

FIG. 22 is a cross-sectional view illustrating a display device according to a seventh exemplary embodiment of the present disclosure.

Referring to FIG. 22, in addition to the display panel configuration of FIG. 21, the display panel 100 further includes a first reflector 32 configured to reflect the infrared light IR from the infrared light source 201. The infrared light source 201 further includes a second reflector 31 configured to reflect the infrared light IR from the first reflector 32 to the light transmitting part AG. The first and second reflectors 32 and 31 reflect the infrared light IR blocked by the pixel circuit and circuit wirings of the display panel 100 toward the light transmitting part AG of the second pixel area CA. The infrared light IR reflected by the first and second reflectors 32 and 31 and the infrared light IR emitted from the emitters 201a are concentrated on the light transmitting part AG. Accordingly, the efficiency of infrared light used for face recognition can be improved by the first and second reflectors 32 and 31.

The first reflector 32 can be formed on a substrate 10 of the display panel 100. The first reflector 32 reflects the infrared light IR incident from the infrared light source 201 toward the second reflector 31. The first reflector 32 can be formed on the substrate 10 under the pixel group in the second pixel area CA. The first reflector 31 can be patterned to have a lower thickness as it approaches the light transmitting part AG, for example, a wedge or tapered shape.

The second reflector 31 is disposed on the infrared light source 201 to face the first reflector 32 under the light transmitting part AG. The infrared light IR reflected from the first reflector 31 is reflected by the second reflector 31 and travels toward the light transmitting part AG. The infrared light IR reflected by the second reflector 31 is incident on the diffraction pattern DOE in the light transmitting part AG at an angle perpendicular to the XY plane of the display panel 100. The second reflector 31 can be patterned in a wedge or tapered shape having a small thickness on the side close to the first reflector 32. At least a portion of the reflective surfaces of the first and second reflectors 32 and 31 can be concavely patterned.

Figure 23:
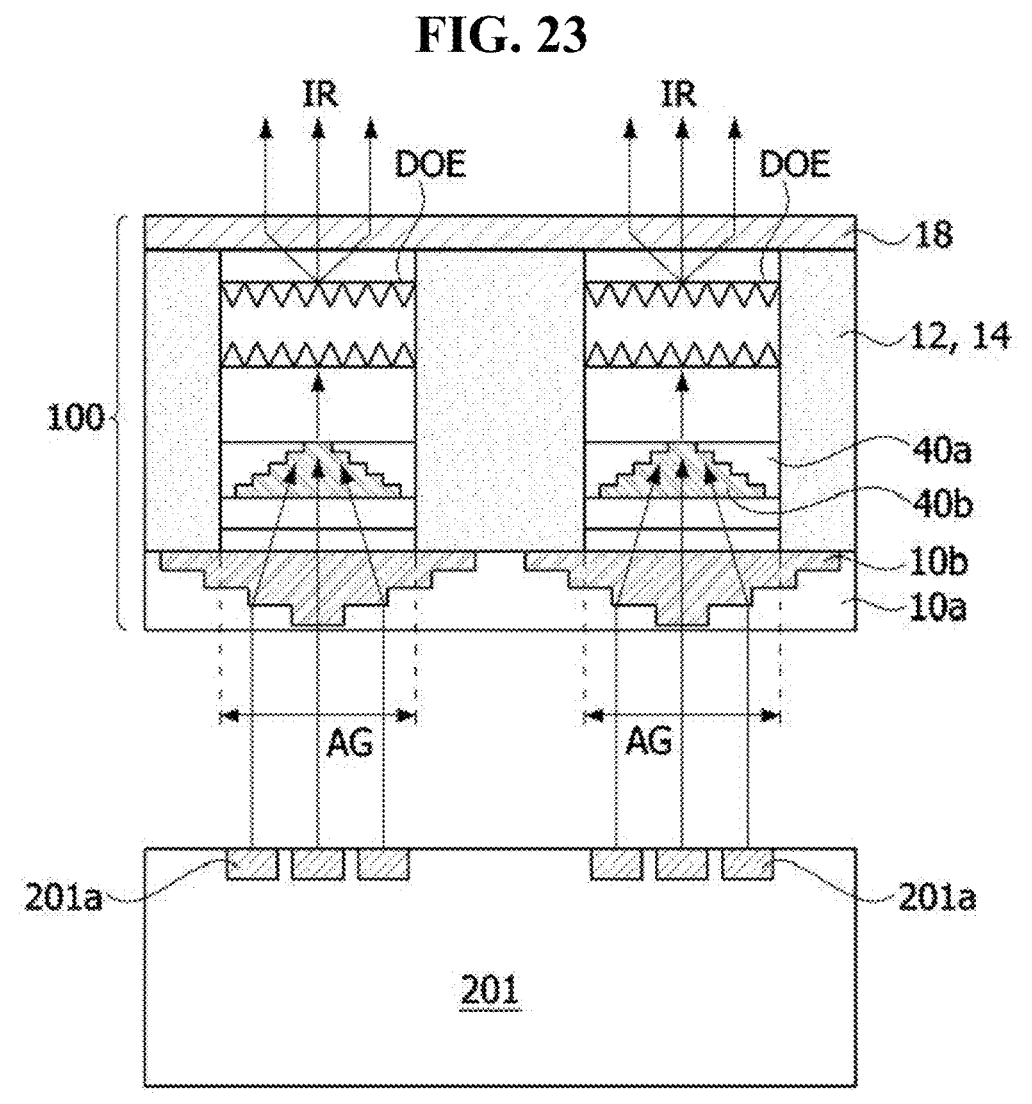

FIG. 23 is a cross-sectional view illustrating a display device according to an eighth exemplary embodiment of the present disclosure.

Referring to FIG. 23, in addition to the display panel configuration of FIG. 21, the display panel 100 further includes light collecting parts 10a and 10b and collimating parts 40a and 40b. Each of the light collecting parts 10a and 10b and the collimating parts 40a and 40b includes a low refractive medium and a high refractive medium bonded to each other, and includes a lens surface. The plurality of emitters 201a of the infrared light source 201 can be disposed under the light transmitting part AG of the second pixel area CA to irradiate infrared light IR to the second pixel area CA. The combined width of the area of the emitters 201a can correspond to the width of the light transmitting part AG.

The light collecting parts 10a and 10b can be formed on the substrate of the display panel 100. The light collecting parts 10a and 10b include a low refractive index substrate 10a including a concave lens, and a high refractive index layer 10b filled in the concave lens to flatten the substrate surface. The centers of the light collecting parts 10a and 10b can coincide with the centers of the light transmitting part AG and the collimating parts 40a and 40b. The size of each of the light collecting parts 10a and 10b is set to be larger than that of the light transmitting part AG. The light collecting parts 10a and 10b concentrate the infrared light IR from the infrared light source 201 and the infrared light IR traveling toward the peripheral pixel group of the light transmitting part AG toward the light transmitting part AG by the difference in refractive index between the mediums and the lens shape. The infrared light IR passing through the light collecting parts 10a and 10b is concentrated on the collimating parts 40a and 40b embedded in the light transmitting part AG.

The collimating parts 40a and 40b are embedded in the light transmitting part AG between the diffraction pattern DOE and the light collecting parts 10a and 10b. The collimating parts 40a and 40b can be formed by patterning thin films having a refractive index difference among organic/inorganic thin film layers composing the circuit layer 12 and the light emitting element layer 14. The collimating parts 40a and 40b include a convex high refractive index layer 40b and a low refractive index layer 40a covering the convex surface of the high refractive index layer 40b to cover the surface. The size of each of the collimating parts 40a and 40b can be substantially the same as the size of the light transmitting part AG. The collimating parts 40a and 40b collimate the infrared light IR passing through the light collecting parts 10*a* and 10*b* at an angle perpendicular to the plane of the diffraction pattern DOE by the difference in refractive index between the mediums and the lens shape. Accordingly, the infrared light IR emitted from the infrared light source 201 is vertically incident on the diffraction pattern DOE in the light transmitting part AR without loss, so that the efficiency of the infrared light IR used for face recognition can be improved.

Figure 24:
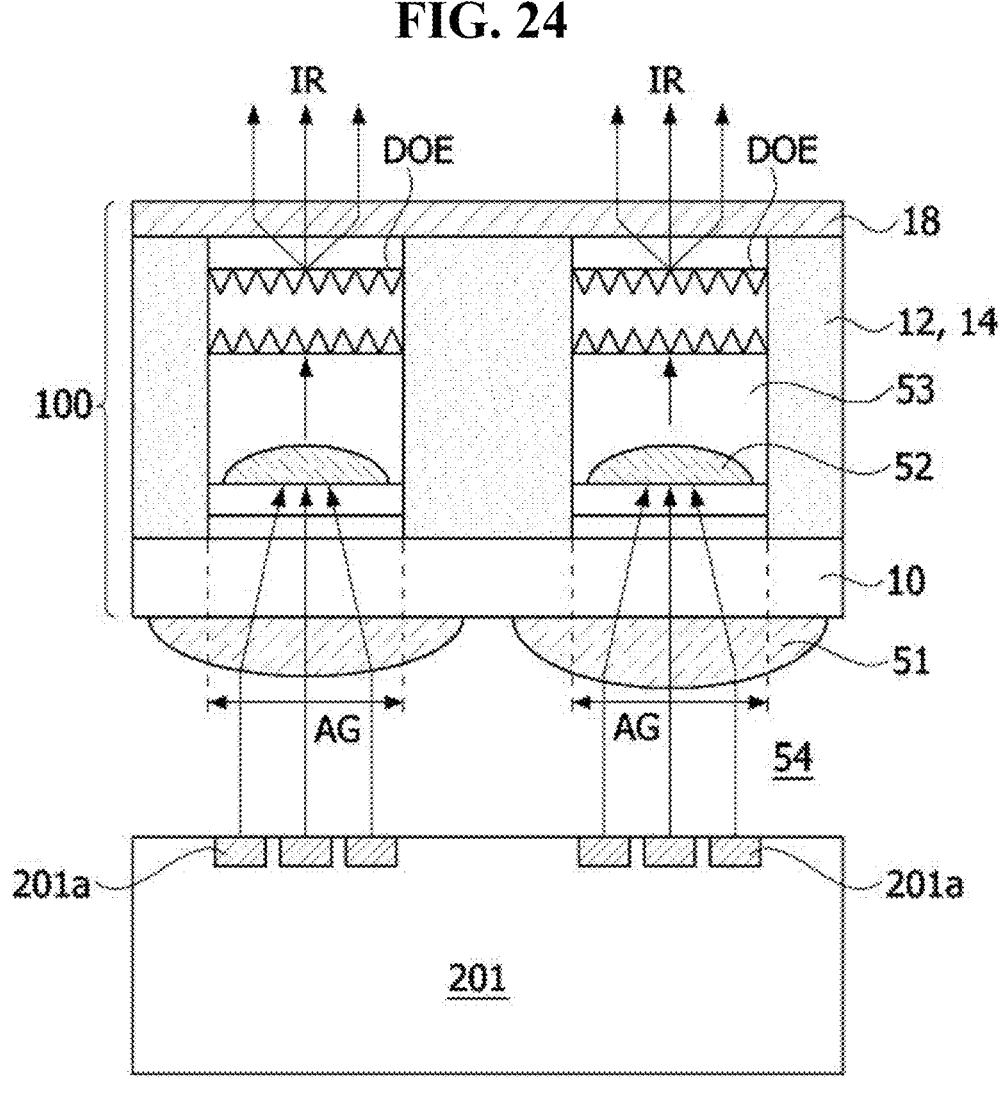
FIG. 24 is a cross-sectional view illustrating a display device according to a ninth exemplary embodiment of the present disclosure.

FIG. 24 is a cross-sectional view illustrating a display device according to a ninth exemplary embodiment of the present disclosure.

Referring to FIG. 24, the display panel 100 includes a first lens 51 facing the infrared light source 201 and a second lens 52 embedded in the light transmitting part AG.

The first lens 51 has a refractive index higher than that of an air layer 54, and includes a convex lens surface toward the infrared light source 201. The air layer 54 can be made of air space. The first lens 51 can be formed by patterning the back surface of the substrate of the display panel 100 in a convex lens shape. The center of the first lens 51 can coincide with the centers of the second lens 52 embedded in the light transmitting part AG and the diffraction pattern DOE. The size (e.g., width) of the first lens 51 is set to be larger than that of the light transmitting part AG. The first lens 51 concentrates the infrared light IR from the infrared light source 201 and the infrared light IR traveling toward the peripheral pixel group of the light transmitting part AG toward the light transmitting part AG by the difference in refractive index with air and the lens shape. The infrared light IR passing through the first lens 51 is concentrated on the second lens 52 embedded in the light transmitting part AG.

The second lens 52 is embedded in the light transmitting part AG between the diffraction pattern DOE and the first lens 51. The second lens 52 has a higher refractive index than a low refractive index layer 53 embedded in the light transmitting part AG, and includes a convex lens surface toward the diffraction pattern DOE. The second lens 52 and the low refractive index layer 53 can be formed by patterning thin films having a refractive index difference among organic/inorganic thin film layers composing the circuit layer 12 and the light emitting element layer 14. The size of the second lens 52 can be substantially the same as the size of the light transmitting part AG. The second lens 52 collimates the infrared light IR passing through the first lens 51 at an angle perpendicular to the plane of the diffraction pattern DOE by the difference in refractive index between the mediums and the lens shape. Accordingly, the infrared light IR emitted from the infrared light source 201 is vertically incident on the diffraction pattern DOE in the light transmitting part AR without loss, so that the efficiency of the infrared light IR used for face recognition can be improved.

In FIGS. 21 and 22, the diffraction pattern DOE can be replaced with the hologram diffraction pattern HOE, e.g., the HOE of FIGS. 16-18.

According to the present disclosure, since an optical module/device is disposed under a screen in which an image is displayed, a full-screen display can be implemented.

According to the present disclosure, the size of an optical module/device can be reduced by embedding a diffractive optical element configured to separate infrared light into a plurality of dot beams used for face recognition in a display panel or forming the diffractive optical element on a cover glass, so that it is possible to make the mobile terminal slim and increase the degree of freedom in design of the mobile terminal.

According to the present disclosure, a diffractive optical element is embedded in a light transmitting part of a pixel area or a diffractive optical element is disposed on a cover glass covering the pixel area, so that infrared light transmittance for face recognition can be improved without a limitation of dot beams which pass through the diffractive optical element being lost due to a circuit layer and a circuit wiring of the display panel.

According to the present disclosure, loss of infrared light due to a pixel circuit and a circuit wiring can be minimized or prevented by condensing and collimating light incident on pixels toward a diffractive optical element, so that the efficiency of infrared light used for face recognition can be improved.

The advantages and effects of the present disclosure are not limited to the above-mentioned advantages and effects, and other advantages and effects that are not mentioned will be apparently understood by those skilled in the art from the following description and the appended claims.

The objects to be achieved by the present disclosure, the means for achieving the objects, and advantages and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and can be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel including a first pixel area and a second pixel area adjacent to the first pixel area, the second pixel area including a plurality of sub-pixels and one or more light transmitting parts disposed between the plurality of sub-pixels;
    a cover glass disposed on a first surface of the display panel and extending to cover the entire second pixel area;
    an optical module disposed under a second surface of the display panel being opposite to the first surface of the display panel, the optical module including an emitter configured to emit infrared light which passes through one of the one or more light transmitting parts of the second pixel area; and
    a diffractive optical element formed on at least one of a thin film layer of a circuit layer or at least one of a thin film layer of a light emitting element layer included in the display panel,
    wherein the diffractive optical element is located within the cover glass and disposed only at a position corresponding to the one of the one or more light transmitting parts of the second pixel area though which the infrared light passes, and wherein the diffractive optical element is configured to separate the infrared light from the optical module into a plurality of dot beams.

2. The display device of claim 1, wherein a PPI (Pixels Per Inch) of the second pixel area is less than a PPI of the first pixel area.

3. The display device of claim 1, wherein the optical module is a light source including the emitter for emitting the infrared light and a collimating lens disposed on the emitter of the light source.

4. The display device of claim 3, wherein the infrared light from the emitter of the light source is incident on the diffractive optical element at an angle substantially perpendicular to a plane of the display panel.

5. The display device of claim 1, wherein a plurality of diffractive optical elements are spaced apart by a predetermined interval and face the light transmitting parts correspondingly, the optical module is a light source which includes the emitter and a plurality of other emitters each generating the infrared light, and the emitter and the plurality of other emitters are disposed under the second surface of the display panel to face the light transmitting parts, respectively.

6. The display device of claim 1, wherein the diffractive optical element includes one or more hologram diffraction patterns.

7. The display device of claim 6, wherein the diffractive optical element covers a plurality of pixels and the light transmitting parts in the second pixel area, the optical module is a light source which includes a plurality of emitters each generating the infrared light, and the plurality of emitters are disposed under the second surface of the display panel to face the light transmitting parts, respectively.

8. The display device of claim 6, wherein the infrared light from the optical module is incident on the hologram diffraction pattern at an angle substantially perpendicular to a plane of the display panel.

9. The display device of claim 6, wherein a plurality of hologram diffractive patterns are spaced apart by a predetermined interval and face the light transmitting parts correspondingly, the optical module is a light source which includes the emitter and a plurality of other emitters each generating infrared light, and the emitter and the plurality of other emitters are disposed under the second surface of the display panel to face the light transmitting parts, respectively.

10. The display device of claim 6, wherein the hologram diffractive pattern covers one or more pixels and the one or more light transmitting parts in the second pixel area, the optical module is a light source which includes a plurality of emitters each generating the infrared light, and the plurality of emitters are disposed under the second surface of the display panel to face the light transmitting parts, respectively.

11. The display device of any one of claim 1, wherein the display panel further comprises:

a touch sensor layer disposed on the plurality of sub-pixels and the one or more light transmitting parts;

a polarizing plate disposed on the touch sensor layer and under the cover glass; and a lens layer disposed between the touch sensor layer and the polarizing plate, wherein the lens layer includes a collimating lens facing at least one of the one or more light transmitting parts.

12. The display device of claim 1, wherein the display panel further comprises a first reflector disposed on a substrate of the display panel under pixels of the second pixel area, and the optical module is a light source which further includes a second reflector disposed under at least one of the one or more light transmitting parts and facing the first reflector.

13. The display device of claim 12, wherein the infrared light from the optical module is reflected by the first reflector, which is further reflected toward the one or more light transmitting parts by the second reflector.

14. The display device of claim 1, wherein the display panel further comprises:

a light collecting part configured to collect the infrared light from the optical module; and a collimating part embedded in at least one of the one or more light transmitting parts between the diffractive optical element and the light collecting part, and configured to collimate the infrared light passing through the light collecting part to the diffractive optical element.

15. The display device of claim 1, wherein a boundary of the diffractive optical element located within the cover glass fully encompasses a boundary of the emitter disposed below the one of the one or more light transmitting parts of the second pixel area through which the infrared light passes.

16. The display device of claim 1, wherein the emitter configured to emit the infrared light, the one of the one or more light transmitting parts of the second pixel area through which the infrared light passes, and the diffractive optical element are vertically stacked in that order, and are substantially aligned with each other.

17. A mobile terminal, comprising:

a display panel configured to display an input image, and including a first pixel area and a second pixel area, the second pixel area including a plurality of sub-pixels and one or more light transmitting parts disposed between the plurality of sub-pixels;

a display panel driver configured to write pixel data of the input image to pixels of the display panel;

a cover glass disposed on a front surface of the display panel and extending to cover the entire second pixel area;

a light source disposed under a rear surface of the display panel to face the second pixel area, and configured to generate infrared light which is to pass through one of the one or more light transmitting parts;

a diffractive optical element formed on at least one of a thin film layer of a circuit layer or at least one of a thin film layer of a light emitting element layer included in the display panel, wherein the diffractive optical element is located within the cover glass and disposed only at a position facing the one of the one or more light transmitting parts of the second pixel area, the diffractive optical element configured to separate the infrared light from the light source into a plurality of dot beams;

an infrared camera disposed under the rear surface of the display panel, and configured to convert the infrared light incident through the display panel into an electrical signal to output facial pattern data; and a host system configured to transmit the pixel data of the input image to the display panel driver, and process user authentication with respect to the facial pattern data received from the infrared camera.

18. The mobile terminal of claim 17, wherein a PPI (Pixels Per Inch) of the second pixel area is less than a PPI of the first pixel area.

19. The mobile terminal of claim 17, wherein the display panel further includes a first reflector disposed on a substrate of the display panel under pixels of the second pixel area, and the light source includes a second reflector disposed under at least one of the one or more light transmitting parts and facing the first reflector.

20. The mobile terminal of claim 17, wherein a boundary of the diffractive optical element located within the cover glass fully encompasses a boundary of the light source disposed below the one of the one or more light transmitting parts through which the infrared light is to pass.

21. The mobile terminal of claim 17, wherein the light source configured to emit the infrared light, the one of the one or more light transmitting parts through which the infrared light is to pass, and the diffractive optical element are vertically stacked in that order, and are substantially aligned with each other.

\* \* \* \* \*